(12) United States Patent
Jo et al.

(10) Patent No.: US 11,720,191 B2
(45) Date of Patent: Aug. 8, 2023

(54) DISPLAY DEVICE

(71) Applicant: SAMSUNG DISPLAY CO., LTD., Yongin-si (KR)

(72) Inventors: Yong Jun Jo, Hwaseong-si (KR); Kwang Chui Jung, Seoul (KR); Dong Soo Kim, Hwaseong-si (KR); Mi Na Kim, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 4 days.

(21) Appl. No.: 17/148,081

(22) Filed: Jan. 13, 2021

(65) Prior Publication Data
US 2021/0286456 A1 Sep. 16, 2021

(30) Foreign Application Priority Data

Mar. 12, 2020 (KR) .......................... 10-2020-0030800

(51) Int. Cl.
G06F 3/041 (2006.01)
G06F 3/044 (2006.01)
H10K 50/842 (2023.01)
H10K 59/131 (2023.01)

(52) U.S. Cl.
CPC .......... *G06F 3/0412* (2013.01); *G06F 3/0446* (2019.05); *H10K 50/8426* (2023.02); *H10K 59/131* (2023.02)

(58) Field of Classification Search
None
See application file for complete search history.

(56) References Cited

U.S. PATENT DOCUMENTS

| | | | |
|---|---|---|---|
| 10,203,785 B2* | 2/2019 | Wang ................. | G06F 3/0412 |
| 2011/0090194 A1* | 4/2011 | Chang ................. | G06F 3/0412 |
| | | | 257/53 |
| 2012/0081328 A1* | 4/2012 | Kandziora ......... | G06F 3/0412 |
| | | | 327/552 |
| 2014/0022187 A1* | 1/2014 | Jeong ................. | G06F 3/0446 |
| | | | 345/173 |
| 2016/0195956 A1* | 7/2016 | Zhao ................... | G06F 3/0412 |
| | | | 345/174 |

(Continued)

FOREIGN PATENT DOCUMENTS

| KR | 10-2015-0080332 | 7/2015 |
|---|---|---|
| KR | 10-2016-0043212 | 4/2016 |

(Continued)

*Primary Examiner* — Christopher R Lamb
(74) *Attorney, Agent, or Firm* — F. Chau & Associates, LLC

(57) ABSTRACT

A display device includes: a first substrate including a display area and a non-display area; a second substrate facing the first substrate; a sealing member disposed in the non-display area and coupling the first substrate to the second substrate; a sensing contact area disposed at an inner side of the sealing member; a sensing signal line disposed in the sensing contact area; a sensing contact pattern disposed in the sensing contact area and electrically connected to the sensing signal line; a control signal line disposed between the first substrate and the sensing signal line; and a shielding pattern disposed between the control signal line and the sensing signal line, the shielding pattern overlapping the control signal line or the sensing signal line.

25 Claims, 16 Drawing Sheets

(56) References Cited

U.S. PATENT DOCUMENTS

| | | | |
|---|---|---|---|
| 2016/0282981 A1* | 9/2016 | Ding | G06F 3/0443 |
| 2019/0073071 A1* | 3/2019 | Ryu | G06F 3/044 |
| 2019/0079623 A1* | 3/2019 | Kim | G06F 3/0443 |

FOREIGN PATENT DOCUMENTS

| | | |
|---|---|---|
| KR | 10-2016-0074805 | 6/2016 |
| KR | 10-2017-0079956 | 7/2017 |
| KR | 10-2018-0014396 | 2/2018 |
| KR | 10-1941255 | 1/2019 |

* cited by examiner

DISPLAY DEVICE

CROSS-REFERENCE TO RELATED APPLICATION

This application claims priority under 35 U.S.C. 119 to Korean Patent Application No. 10-2020-0030800 filed on Mar. 12, 2020 in the Korean Intellectual Property Office, the disclosure of which is incorporated by reference herein in its entirety.

TECHNICAL FIELD

The present invention relates to a display device.

DESCRIPTION OF THE RELATED ART

Electronic apparatuses such as a smartphone, a tablet personal computer (PC), a digital camera, a laptop computer, a navigation device and a smart television, may include a display device for displaying images. The display device may include a display panel and associated circuitry for generating and displaying an image and various input devices.

A display device such as a smartphone or tablet PC may include a sensor that recognizes touch or near proximity as an input device. Such a sensor is convenient and has replaced a conventional keypad, which is a physical input device, to reduce wear and tear.

An organic light emitting display device may be provided with an in-cell touch structure. The in-cell touch structure has a first substrate provided with an organic light emitting element and a second substrate provided with a sensing electrode array. The first and second substrates face each other and are bonded to each other by a sealing member. The in-cell touch structure may also include a sensing contact portion for applying a signal to the sensing electrode array.

SUMMARY

According to an exemplary embodiment of the present invention, there is provided a display device including: a first substrate including a display area and a non-display area; a second substrate facing the first substrate; a sealing member disposed in the non-display area and coupling the first substrate to the second substrate; a sensing contact area disposed at an inner side of the sealing member; a sensing signal line disposed in the sensing contact area; a sensing contact pattern disposed in the sensing contact area and electrically connected to the sensing signal line; a control signal line disposed between the first substrate and the sensing signal line; and a shielding pattern disposed between the control signal line and the sensing signal line, the shielding pattern overlapping the control signal line or the sensing signal line.

According to an exemplary embodiment of the present invention, there is provided a display device including: a first substrate including a display area and a non-display area surrounding the display area, the non-display area including a sensing contact area; a second substrate facing the first substrate; a sensing signal line located between the first substrate and the second substrate and located in the sensing contact area; a conductive member disposed in the sensing contact area and electrically connected to the sensing signal line; a control signal line disposed between the first substrate and the sensing signal line; and a voltage line disposed between the control signal line and the sensing signal line, the voltage line overlapping the control signal line or the sensing signal line.

According to an exemplary embodiment of the present invention, there is provided a display device including: a first substrate including a display area and a non-display area; a second substrate facing the first substrate; a sealing member disposed in the non-display area; a contact pattern disposed adjacent to the sealing member; and a signal line in contact with the contact pattern at a first side of the sealing member and extending to a second side of the sealing member.

BRIEF DESCRIPTION OF THE DRAWINGS

The above and other features of the present invention will become more apparent by describing in detail exemplary embodiments thereof with reference to the attached drawings, in which.

DETAILED DESCRIPTION OF THE EMBODIMENTS

Figure 1:
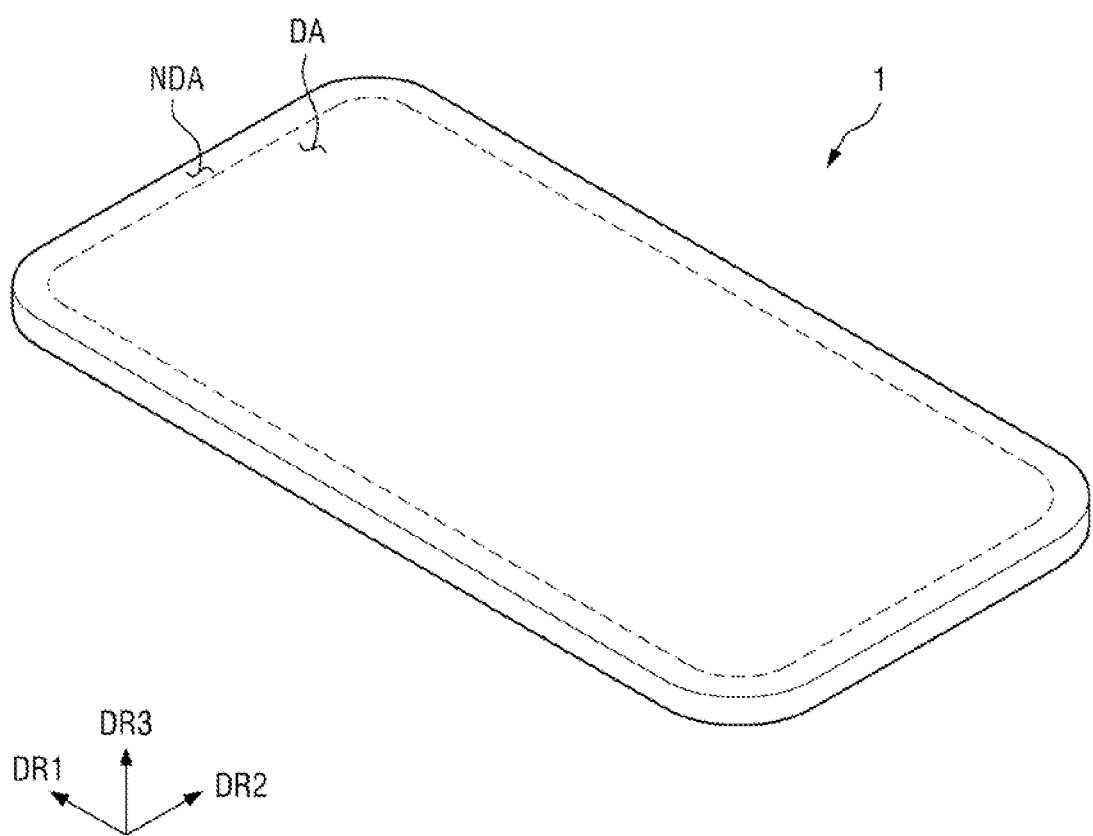
FIG. 1 is a perspective view showing a display device according to an exemplary embodiment of the present invention.

Exemplary embodiments of the present invention will now be described more fully hereinafter with reference to the accompanying drawings. This invention may, however, be embodied in different forms and should not be construed as limited to the embodiments set forth herein. The same reference numbers may indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present.

Exemplary embodiments of the present invention will be described with reference to perspective views, cross-sectional views, and/or plan views. It is to be understood however that the profile of an exemplary view may be modified according to manufacturing techniques and/or allowances. In other words, the invention should not be limited by the views shown, but cover all changes and modifications that can be caused due to a change in manufacturing process.

Unless otherwise defined, the terms "above," "upper side," "upper portion," "top," and "top surface," as used herein, may refer to a direction indicated by an arrow in a third direction DR3 intersecting first and second directions DR1 and DR2 as shown in the drawings, and the terms "below," "lower side," "lower portion," "bottom," and "bottom surface," as used herein, may refer to a direction opposite to the direction indicated by the arrow in the third direction DR3 as shown in the drawings.

FIG. 1 is a perspective view showing a display device according to an exemplary embodiment of the present invention.

Referring to FIG. 1, a display device 1 displays a moving image or a still image. The display device 1 may refer to any electronic device having a display screen. Examples of the display device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like.

The display device 1 includes a display panel which has a display screen. Examples of the display panel may include a light emitting diode (LED) display panel, an organic light emitting display panel, a quantum dot light emitting display panel, a plasma display panel and a field emission display panel. Hereinafter, a case in which an LED display panel is the display panel will be described, but the present invention is not limited thereto, and other display panels may be applied ideas as the display panel.

The shape of the display device 1 may be variously modified. For example, the display device 1 may have a shape such as a rectangular shape elongated in a horizontal direction, a rectangular shape elongated in a vertical direction, a square shape, a quadrilateral shape with rounded corners (or vertices), other polygonal shapes and a circular shape. The shape of a display area DA of the display device 1 may also be similar to the overall shape of the display device 1. In FIG. 1, the display device 1 and the display area DA having a rectangular shape elongated in the horizontal direction are illustrated.

The display device 1 may include the display area DA and a non-display area NDA. The display area DA is an area where an image can be displayed, and the non-display area NDA is an area where an image is not displayed. The display area DA may also be referred to as an active region, and the non-display area NDA may also be referred to as a non-active region.

The display area DA may occupy the center of the display device 1. For example, the display area DA may be located in the center of the display device 1 and extend to the edges of the display device 1 along the first and second directions DR1 and DR2. The display area DA may include a plurality of pixels. The plurality of pixels may be arranged in a matrix. The shape of each pixel may be a rectangular or square shape in a plan view. However, the present invention is not limited thereto, and each pixel may be a rhombic shape in which each side thereof is inclined with respect to the first direction DR1.

Figure 2:
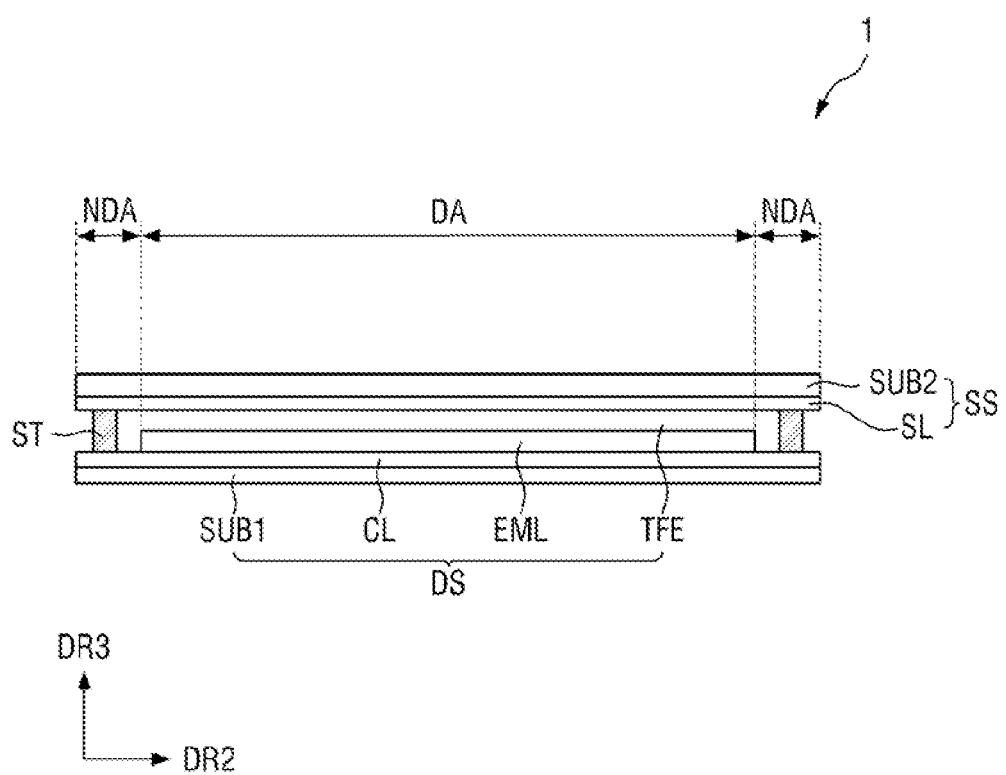
FIG. 2 is a schematic cross-sectional view of the display device of FIG. 1.

FIG. 2 is a schematic cross-sectional view of the display device 1 of FIG. 1.

Referring to FIG. 2, the display device 1 may include a display substrate DS and a sensing substrate SS. The display substrate DS and the sensing substrate SS may be opposed to each other and may be coupled by a sealing member ST. In other words, the display substrate DS and the sensing substrate SS may overlap each other. The sealing member ST may be disposed along the edges of the display substrate DS and the sensing substrate SS. The sealing member ST may bond a first substrate SUB1 of the display substrate DS to a second substrate SUB2 of the sensing substrate SS. The sealing member ST may be a frit adhesive layer, an ultraviolet curing resin, or a thermosetting resin, but is not limited thereto.

The display substrate DS may generate an image, and the sensing substrate SS may acquire coordinate information of an external input (e.g., a sensing event). For example, the sensing substrate SS may acquire coordinates indicative of the location where the external input was received. The display device 1 may further include a protection member disposed below the display substrate DS, an anti-reflection member and/or a window member disposed above the sensing substrate SS.

The display substrate DS may be a display panel including a self-light emitting element. For example, the self-light emitting element may include an organic light emitting diode, a quantum dot light emitting diode, a micro light emitting diode (e.g., a micro LED) based on inorganic materials, or a nano light emitting diode (e.g., a nano LED) based on inorganic materials. Hereinafter, for simplicity of description, a case where the self-light emitting element is an organic light emitting element will be mainly described.

The display substrate DS may include the first substrate SUB1, a circuit element layer CL, a light emitting element layer EML, and a thin film encapsulation layer TFE which are sequentially disposed on the first substrate SUB1. The thin film encapsulation layer TFE may be closest to the sensing substrate SS and the thin film encapsulation layer TFE may cover sides of the light emitting element layer EML. The display substrate DS may further include functional layers such as an antireflection layer and a refractive index control layer.

The first substrate SUB1 may be made of an insulating material such as glass, quartz, or polymer resin. Examples of the polymeric material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The first substrate SUB1 may include a metal material.

The first substrate SUB1 may be a rigid substrate or a flexible substrate which can be bent, folded or rolled. An example of the material of the flexible substrate may be polyimide (PI), but is not limited thereto.

The circuit element layer CL may include a circuit element and an insulating layer. The insulating layer includes at least one inorganic layer and at least one organic layer. The circuit element includes signal lines, a driving circuit for pixels (e.g., a data driver or a gate driver), and the like. The circuit element layer CL may be formed through a process of forming an insulating layer by coating or deposition, and a patterning process of a conductor layer and/or a semiconductor layer by a photolithography process.

The light emitting element layer EML includes a self-light emitting element. For example, the self-light emitting element may be an organic light emitting element. The light emitting element layer EML may further include an organic layer such as a pixel defining layer.

The thin film encapsulation layer TFE may seal the light emitting element layer EML. The thin film encapsulation layer TFE may include at least one inorganic layer (hereinafter, referred to as an encapsulation inorganic layer). The encapsulation inorganic layer may protect the light emitting element layer EML from moisture and oxygen. The encapsulation inorganic layer may include a silicon nitride layer, a silicon oxynitride layer and a silicon oxide layer, a titanium oxide layer, or an aluminum oxide layer.

The thin film encapsulation layer TFE may further include at least one organic layer (hereinafter, referred to as an encapsulation organic layer). The encapsulation organic layer may protect the light emitting device layer EML) from foreign substances such as dust particles. The encapsulation organic layer may include an acrylic organic layer, but is not limited thereto.

In another exemplary embodiment of the present invention, the thin film encapsulation layer TFE may be replaced with an encapsulation substrate or the like. The encapsulation substrate may seal the light emitting element layer EML by a sealing member.

The sensing substrate SS may include the second substrate SUB2 and a sensing element layer SL disposed on the second substrate SUB2. The sensing element layer SL may be in direct contact with the second substrate SUB2 and be closer to the thin film encapsulation layer TFE than the second substrate SUB2. The sensing substrate SS may sense an external input, for example, by using a capacitance method. The capacitance method may obtain coordinate information of a sensed point by a self-capacitance method or a mutual capacitance method.

In some exemplary embodiments of the present invention, the sensing substrate SS may function as the encapsulation substrate described above. In other words, the second substrate SUB2 of the sensing substrate SS may be an encapsulation substrate. When the second substrate SUB2 functions as an encapsulation substrate, the above-described thin film encapsulation layer TFE may be omitted.

A detailed description of the sensing substrate SS will be described later with reference to FIG. 6A.

Figure 3:
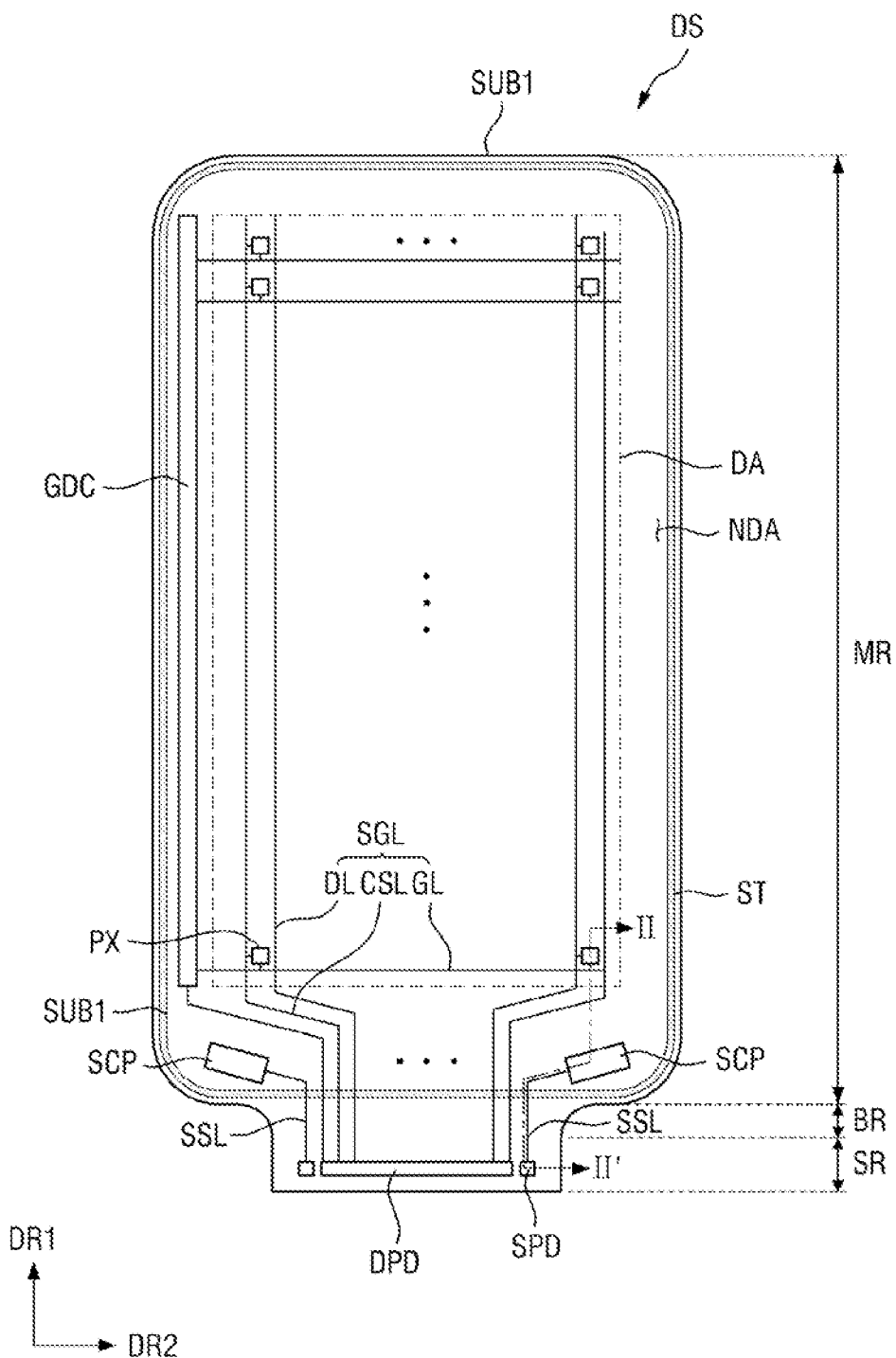
FIG. 3 is a plan view of a display substrate of a display device according to an exemplary embodiment of the present invention.
Figure 4:
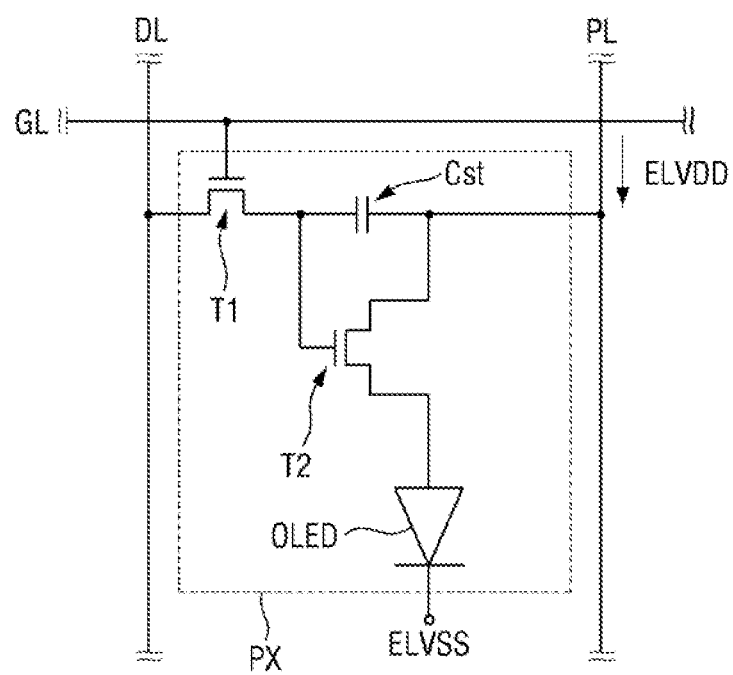
FIG. 4 is an exemplary circuit diagram of a pixel of FIG. 3.

FIG. 3 is a plan view of a display substrate of a display device according to an exemplary embodiment of the present invention. FIG. 4 is an exemplary circuit diagram of a pixel of FIG. 3.

Referring to FIGS. 3 and 4, the display substrate DS may include a main region MR and a bending region BR connected to one side of the main region MR. The display substrate DS may further include a sub-region SR connected to the bending region BR. The sub-region SR may overlap the main region MR in a thickness direction after the display substrate DS is bent. For example, the sub-region SR may be disposed below the main region MR when the display substrate DS is bent.

The main region MR may include the display area DA. The peripheral edge portion of the display area DA of the main region MR may be the non-display area NDA.

The main region MR may have a shape similar to an outer shape of the display device 1 in plan view. The main region MR may be a flat region located on one surface. However, the present invention is not limited thereto, and at least one edge of the edges of the main region MR except for an edge (or side) of the main region MR connected to the bending region BR may be bent in a curved shape or bent in a vertical direction.

If at least one of the edges other than the edge of the main region MR connected to the bending region BR is curved or bent, the display area DA may also be disposed on the corresponding edge. However, the present invention is not limited thereto, and the non-display area NDA that does not display an image may be disposed on the curved or bent edge. Alternatively, both the display area DA and the non-display area NDA may be disposed on the curved or bent edge.

The non-display area NDA of the main region MR may be placed in an area from the outer boundary of the display area DA to the edge of the display substrate DS. A control signal line CSL or the like may be disposed in the non-display area NDA of the main region MR to apply a signal to the display area DA. For example, the control signal line CSL may provide a signal to a data line DL in the display area DA. Further, the outermost black matrix may be disposed in the non-display area NDA of the main region MR, but the present invention is not limited thereto.

The bending region BR is connected to the main region MR. For example, the bending region BR may be connected through one short side of the main region MR. In the bending region BR, the display substrate DS may be bent with a curvature in a direction opposite to the third direction DR3, e.g., a direction opposite to a display surface. The surface of the display substrate DS may be reversed as the display substrate DS is bent in the bending region BR. In other words, one surface of the display substrate DS facing upward may be changed to face outward through the bending region BR and then to face downward.

The sub-region SR extends from the bending region BR. The sub-region SR may extend in a direction parallel to the main region MR from a point where bending of the display substrate DS is completed. The sub-region SR may overlap the main region MR in the third direction DR3, e.g., in the thickness direction, of the display substrate DS. The sub-region SR may overlap the non-display area NDA of the edge of the main region MR and further overlap the display area DA of the main region MR.

A driving chip (or a pad portion in which a driving chip is disposed and which is electrically connected to the driving chip) may be disposed on the sub-region SR of the display substrate DS. The driving chip may generate a driving signal for driving a pixel PX and provide it to the pixel PX in the display area DA. For example, the driving chip may generate a data signal that determines the light emission luminance of the pixel PX. In this case, the driving chip may provide a data signal to the pixel PX through a data line DL.

The driving chip may be attached to the display substrate DS through an anisotropic conductive film, or through ultrasonic bonding.

A driving substrate may be connected to the side surface of the sub-region SR of the display substrate DS. Pad portions DPD and SPD may be provided on the side surface of the sub-region SR, and a driving substrate may be connected to the pad portions DPD and SPD. The driving substrate may be a flexible printed circuit board or film.

The pixels PX and signal lines SGL electrically connected to the pixels PX may be disposed in the display area DA of the main region MR.

The signal lines SGL may include scan lines GL and data lines DL. The scan lines GL may be formed in parallel in the second direction DR2, and the data lines DL may be formed in parallel in the first direction DR1 which intersects the second direction DR2.

The pixel PX may be connected to at least one of the scan lines GL and one of the data lines DL. The pixel PX may include a light emitting element OLED and a driving circuit for driving the light emitting element OLED. The driving circuit may include a first transistor (T1 or a switching transistor), a second transistor (T2 or a driving transistor), and a capacitor Cst (e.g., a storage capacitor).

A first source voltage ELVDD may be provided to the second transistor T2, and a second source voltage ELVSS may be provided to the light emitting element OLED. For example, one terminal of the second transistor T2 may be applied with the first source voltage ELVDD and one terminal of the light emitting element OLED may be applied with the second source voltage ELVSS. The second source voltage ELVSS may be lower than the first source voltage ELVDD.

The first transistor T1 may output a data signal applied to the data line DL in response to a scan signal applied to the scan line GL. The capacitor Cst may charge a voltage corresponding to the data signal received from the first transistor T1.

The second transistor T2 may be connected to the light emitting element OLED. The second transistor T2 may control a driving current flowing in the light emitting element OLED in response to the amount of charges stored in the capacitor Cst. The above-described circuit is merely exemplary and is not limited thereto. In other words, the pixel PX may further include a plurality of transistors or a plurality of capacitors. Further, the light emitting element OLED may be connected between a power line PL and the second transistor T2. A detailed description of the cross-sectional structure of the pixel PX will be described later with reference to FIG. 5.

A scan driver GDC may be disposed in the non-display area NDA of the main area MR.

The scan driver GDC may be connected to a display driving circuit through a plurality of control signal lines CSL. Therefore, the scan driver GDC may receive a scan control signal of the display driving circuit. The scan driver GDC generates scan signals according to the scan control signal and supplies the scan signals to the scan lines GL.

Although FIG. 3 illustrates that the scan driver GDC is formed in the non-display area NDA on the left outside of the display area DA, the present invention is not limited thereto. For example, the scan driver GDC may be formed in the non-display area NDA on the left outside and the right outside of the display area DA.

The display driving circuit may be connected to a display pad portion DPD to receive digital video data and timing signals. The display driving circuit may convert digital video data into analog positive/negative data voltages and supply them to the data lines DL. Further, the display driving circuit may generate and supply a scan control signal for controlling the scan driver GDC through a plurality of scan control lines CSL. The pixels PX to which the data voltages are to be supplied may be selected by the scan signals of the scan driver GDC, and the data voltages may be supplied to the selected pixels PX.

A sensing contact portion SCP may be further disposed in the non-display area NDA of the main region MR. In another exemplary embodiment of the present invention, the sensing contact portion SP may be located in the bending region BR or the sub-region SR. A sensing signal line SSL of the display substrate DS and a sensing contact pattern SCPT of the sensing substrate SS to be described later may be electrically connected to the sensing contact portion SCP. The sensing contact portion SCP may also be referred to as a sensing contact area. A detailed description thereof will be given later.

A plurality of pad portions DPD and SPD may be disposed in the sub-region SR. The plurality of pad portions DPD and SPD may include a display pad portion DPD and a sensing pad portion SPD. As shown in FIG. 3, the display pad portion DPD may be disposed between the sensing pad portion SPD disposed on one side of the display substrate DS and the sensing pad portion SPD disposed on the other side of the display substrate DS, but the arrangement of the pad portions DPD and SPD is not limited thereto. The display pad portion DPD may be electrically connected to the signal line SGL as described above. The sensing pad portion SPD may be electrically connected to sensing electrodes of the sensing element layer SL through the sensing signal line SSL. A detailed description thereof will be described later with reference to FIG. 9.

Figure 5:
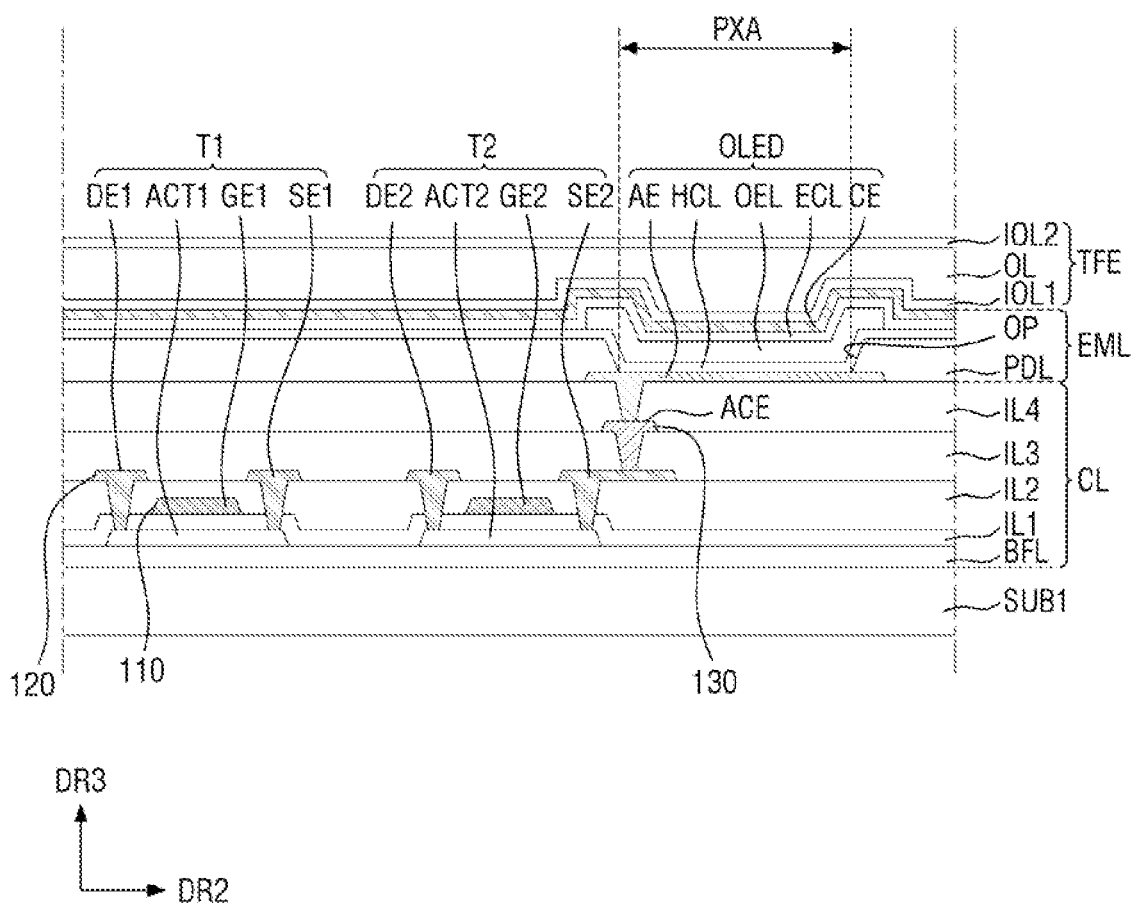
FIG. 5 is a cross-sectional view illustrating the pixel of FIG. 4.

FIG. 5 is a cross-sectional view illustrating the pixel of FIG. 4.

Referring to FIG. 5, the circuit element layer CL is disposed on the first substrate SUB1. The circuit element layer CL may include a first transistor T1, a second transistor T2, a buffer layer BFL, a first insulating layer IL1, a second insulating layer IL2, a third insulating layer IL3, and a fourth insulating layer IL4. The buffer layer BFL, first insulating layer IL1, second insulating layer IL2, third insulating layer IL3, and fourth insulating layer IL4 may be sequentially stacked.

The buffer layer BFL may be disposed on one surface of the first substrate SUB1. The buffer layer BFL may be formed on one surface of the first substrate SUB1 to protect a light emitting layer OEL of the light emitting element layer EML and the first and second transistors T1 and T2 from moisture penetrating through the first substrate SUB1. The buffer layer BFL may be formed of a plurality of inorganic layers that are alternately stacked. For example, the buffer layer BFL may be formed of multiple layers in which one or more inorganic layers of a silicon nitride layer, a silicon oxynitride layer, a silicon oxide layer, a titanium oxide layer and an aluminum oxide layer that are alternately stacked. The buffer layer BFL may be omitted.

The first and second transistors T1 and T2 are disposed on the buffer layer BFL. For example, semiconductor layers ACT1 and ACT2 of the first and second transistors T1 and T2 may be disposed on the buffer layer BFL. The semiconductor layers ACT1 and ACT2 may include a first semiconductor layer ACT1 of the first transistor T1 and a second semiconductor layer ACT2 of the second transistor T2. The semiconductor layers ACT1 and ACT2 may include polycrystalline silicon, monocrystalline silicon, low-temperature polycrystalline silicon, amorphous silicon, or an oxide semiconductor. For example, the oxide semiconductor may include a binary compound (ABx), a ternary compound (ABxCy), or a quaternary compound (ABxCyDz) including indium, zinc, gallium, tin, titanium, aluminum, hafnium (Hf), zirconium (Zr), magnesium (Mg) and the like. For example, the semiconductor layers ACT1 and ACT2 may include ITZO (an oxide including indium, tin and titanium) or IGZO (an oxide including indium, gallium and tin). A light blocking layer may be formed between the buffer layer BFL and each of the semiconductor layers ACT1 and ACT2 to block external light incident on the semiconductor layers ACT1 and ACT2.

The first insulating layer IL1 may be formed on the semiconductor layers ACT1 and ACT2. The first insulating layer IL1 may be formed of an inorganic layer, for example, a silicon nitride layer, a silicon oxynitride layer, a silicon oxide layer, a titanium oxide layer, or an aluminum oxide layer. Although FIG. 5 illustrates that the first insulating layer IL1 is also formed in a region other than regions overlapping gate electrodes GE1 and GE2, the present invention is not limited thereto. For example, the first insulating layer IL1 may be formed only in regions overlapping the gate electrodes GE1 and GE2.

A first conductive layer 110 may be disposed on the first insulating layer IL1. The first conductive layer 110 may include a first gate electrode GE1 of the first transistor T1 and a second gate electrode GE2 of the second transistor T2. The first conductive layer 110 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second insulating layer IL2 may be disposed on the first conductive layer 110. The second insulating layer IL2 may be formed of an inorganic layer, for example, a silicon nitride layer, a silicon oxynitride layer, a silicon oxide layer, a titanium oxide layer, or an aluminum oxide layer.

A second conductive layer 120 may be disposed on the second insulating layer IL2.

The second conductive layer 120 may include a first source electrode SE1 and a first drain electrode DE1 of the first transistor T1 and a second source electrode SE2 and a second drain electrode DE2 of the second transistor T2.

Each of the first source electrode SE1 and the first drain electrode DE1 may be connected to the first semiconductor layer ACT1 through a contact hole passing through the first insulating layer IL1 and the second insulating layer IL2. For example, the first source electrode SE1 may contact an upper portion of the first semiconductor layer ACT1.

Each of the second source electrode SE2 and the second drain electrode DE2 may be connected to the second semiconductor layer ACT2 through a contact hole passing through the first insulating layer IL1 and the second insulating layer IL2. For example, the second source electrode SE2 may contact an upper portion of the second semiconductor layer ACT2.

The second conductive layer 120 may include at least one metal such as aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) or copper (Cu). The second conductive layer 120 may be a single layer or a multilayer. For example, the second conductive layer 120 may have a stacked structure of Ti/Al/Ti, Mo/Al/Mo, Mo/AlGe/Mo, or Ti/Cu.

The third insulating layer IL3 may be disposed on the second conductive layer 120. The third insulating layer IL3 may be formed of an organic layer such as acryl resin, epoxy resin, phenolic resin, polyamide resin, polyimide resin and the like. The third insulating layer IL3 may also be disposed on the second insulating layer IL2.

A third conductive layer 130 may be disposed on the third insulating layer 113. The third conductive layer 130 may be made of the same material as the second conductive layer 120 described above, or may include a material such as a constituent material of the second conductive layer 120.

The third conductive layer 130 may include a connection pattern ACE. The connection pattern ACE may connect a first electrode AE, which will be described later, to the second source electrode SE2 of the second transistor T2. The connection pattern ACE may contact the second source electrode SE2 through a contact hole passing through the third insulating layer 113. Although FIG. 5 illustrates a case where the connection pattern ACE is connected to the second source electrode SE2, the present invention is not limited thereto. In other words, the connection pattern ACE may be connected to the second drain electrode DE2, and in this case, the connection pattern ACE may connect the first electrode AE to the second drain electrode DE2.

The fourth insulating layer IL4 may be disposed on the third conductive layer 130 and the third insulating layer IL3. The fourth insulating layer IL4 may be made of the same material as the above-described third insulating layer IL3, or may include a material such as a constituent material of the third insulating layer IL3.

The light emitting element layer EML is disposed on the circuit element layer CL. The light emitting element layer EML may include the light emitting element OLED and a pixel defining layer PDL.

The light emitting element OLED and the pixel defining layer PDL may be disposed on the fourth insulating layer ILA.

Each of the light emitting elements OLED may include a first electrode AE, a light emitting layer OEL, and a second electrode CE. The first electrode AE may be an anode and the second electrode CE may be a cathode.

The first electrode AE may be disposed on the fourth insulating layer L4. The first electrode AE may be electrically connected to the connection pattern ACE through a contact hole passing through the fourth insulating layer IL4. Accordingly, the first electrode AE may be electrically connected to the second transistor T2 through the connection pattern ACE.

In a top emission structure in which light is emitted toward the second electrode CE when viewed with respect to the light emitting layer OEL, the first electrode AE may be formed of a metal material having high reflectivity to have a stacked structure (Ti/AL/Ti) of aluminum and titanium, a stacked structure (ITO/Al/ITO) of aluminum and ITO, an APC alloy, and a stacked structure (ITO/APC/ITO) of an APC alloy and ITO. The APC alloy is an alloy of silver (Ag), palladium (Pd) and copper (Cu).

In a bottom emission structure in which light is emitted toward the first electrode AE when viewed with respect to the light emitting layer OEL, the first electrode AE may be formed of a transparent conductive material (TCO) such as ITO or IZO capable of transmitting light, or a semi-transmissive conductive material such as magnesium (Mg), silver (Ag), or an alloy of magnesium (Mg) and silver (Ag). In this case, when the first electrode AE is formed of a semi-transmissive metal material, the light emission efficiency can be increased due to a micro-cavity effect.

The pixel defining layer PDL may be formed to partition the first electrode AE to define an emission region PXA of the pixel PX. In other words, the emission region PXA may be formed in an opening OP of the pixel defining layer PDL.

The pixel defining layer PDL may be formed to cover an edge of the first electrode AE. The pixel defining layer PDL may be formed of an organic layer such as acryl resin, epoxy resin, phenolic resin, polyamide resin, polyimide resin and the like.

The emission region PXA refers to a region where the first electrode AE, the light emitting layer OEL and the second electrode CE are stacked sequentially and holes from the first electrode AE and electrons from the second electrode CE are coupled to each other in the light emitting layer OEL to emit light.

The light emitting layer OEL is disposed on the first electrode AE and the pixel defining layer PDL. The light emitting layer OEL may include an organic material to emit light in a predetermined color. A hole control layer HCL may be further disposed between the light emitting layer OEL and the first electrode AE. The hole control layer HCL may also be commonly formed in regions other than the emission region PXA. For example, the hole control layer HCL may be formed to overlap the first and second transistors T1 and T2. An electron control layer ECL may be further disposed between the light emitting layer OEL and the second electrode CE. The electron control layer ECL may also be commonly formed in regions other than the emission region PXA. For example, the electron control layer ECL may be formed to overlap the first and second transistors T1 and T2.

The second electrode CE is disposed on the electron control layer ECL. The second electrode CE may be formed to cover the light emitting layer OEL. The second electrode CE may be a layer commonly formed on the pixels PX. A capping layer may be further disposed on the second electrode CE.

In the top emission type structure, the second electrode CE may be formed of a transparent conductive material (TCO) such as ITO or IZO capable of transmitting light or a semi-transmissive conductive material such as magnesium (Mg), silver (Ag), or an alloy of magnesium (Mg) and silver (Ag). When the second electrode CE is formed of a semi-transmissive conductive material, the light emission efficiency can be increased due to a micro-cavity effect.

In the bottom emission structure, the second electrode CE may be formed of a metal material, having high reflectivity, such as a stacked structure (Ti/Al/Ti) of aluminum (Al) and titanium (Ti), a stacked structure (ITO/AV/ITO) of Al and ITO, an APC alloy, a stacked structure (ITO/APC/ITO) of an APC alloy and ITO, or the like. The APC alloy is an alloy of silver (Ag), palladium (Pd) and copper (Cu).

The thin film encapsulation layer TFE may be disposed on the light emitting element layer EML. The thin film encapsulation layer TFE is disposed on the second electrode CE. The thin film encapsulation layer TFE may be disposed in common to the pixels PX. A capping layer may be further disposed between the thin film encapsulation layer TFE and the second electrode CE. In this case, the thin film encapsulation layer TFE may directly cover the capping layer.

The thin film encapsulation layer TFE may include a first encapsulation inorganic layer IOL1, an encapsulation organic layer OL1 and a second encapsulation inorganic layer IOL2 sequentially stacked on the second electrode CE.

Each of the first encapsulation inorganic layer IOL1 and the second encapsulation inorganic layer IOL2 may be formed of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride or the like.

The encapsulation organic layer OL1 may be formed of acrylic resin, methacrylic resin, polyisoprene, vinyl resin, epoxy resin, urethane resin, cellulose resin, perylene resin or the like.

However, the structure of the thin film encapsulation layer TFE is not limited to the above-described example. In addition, the stacked structure of the thin film encapsulation layer TFE may be variously changed.

In addition, as described above, when the sensing substrate itself functions as an encapsulation substrate, the thin film encapsulation layer TFE illustrated in FIG. 5 may be omitted.

Figure 6A:
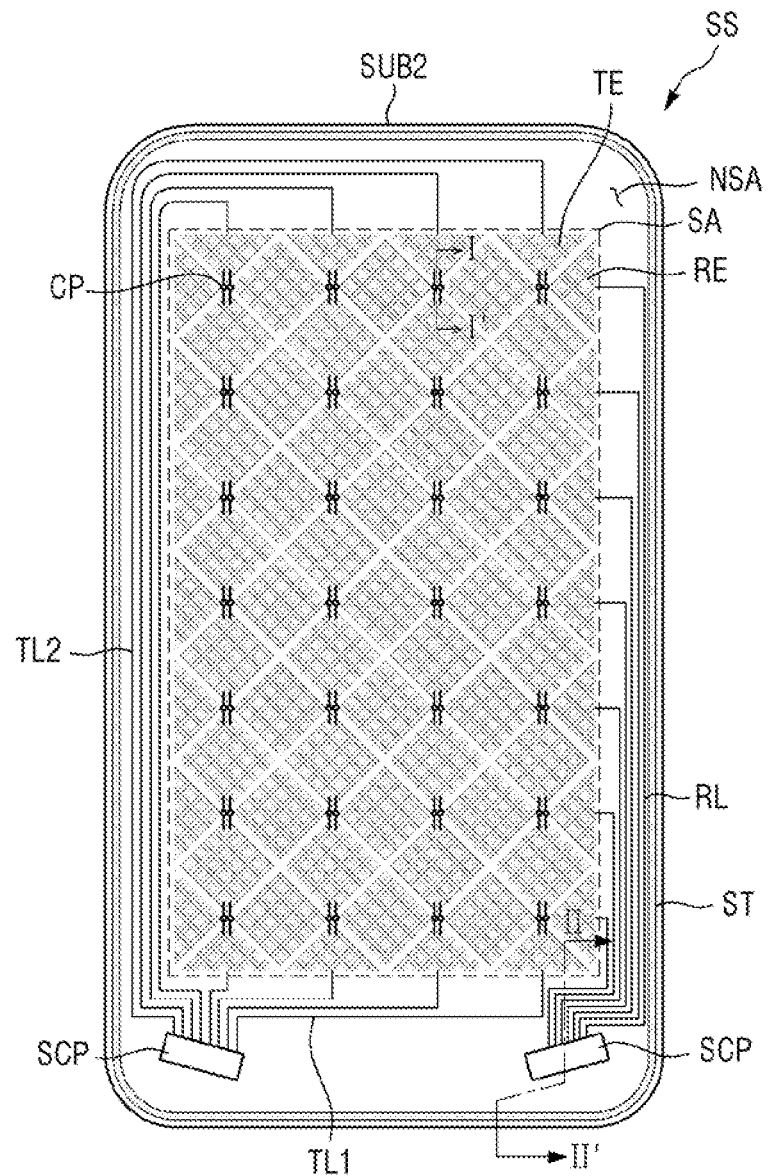
FIG. 6A is a plan view of a sensing substrate of a display device according to an exemplary embodiment of the present invention.

FIG. 6A is a plan view of a sensing substrate of a display device according to an exemplary embodiment of the present invention.

Referring to FIG. 6A, the sensing substrate SS includes a sensing area SA for sensing an external input (e.g., a user's touch) and a sensing peripheral area NSA disposed around the sensing area SA.

The sensing area SA may overlap the display area DA. A plurality of first sensing electrodes TE, second sensing electrodes RE, and sensing connection electrodes CP may be disposed in the sensing area SA. The first sensing electrode TE and the second sensing electrode RE may be disposed to be spaced apart from each other. For example, as shown in FIG. 6A, a gap may be formed between the first sensing electrode TE and the second sensing electrode RE.

The plurality of first sensing electrodes TE may be arranged in a plurality of columns along the first direction DR1, and the plurality of second sensing electrodes RE may be arranged in a plurality of rows along the second direction DR2. The first sensing electrodes TE disposed in the first direction DR) in each of the plurality of columns may be electrically connected. For example, a pair of the first sensing electrodes TE in a column may be electrically connected to each other by a sensing connection electrode CP. Further, the second sensing electrodes RE disposed in the second direction DR2 in each of the plurality of rows may be electrically connected. For example, a pair of the second sensing electrodes RE in a row may be electrically connected to each other by a connection electrode.

The first sensing electrode TE and the second sensing electrode RE may be formed in a diamond shape or a triangular shape in a plan view. For example, the first sensing electrodes TE and the second sensing electrodes RE disposed on the edge of the sensing area SA may have a triangular shape in a plan view, and the other first sensing electrodes TE and the other second sensing electrodes RE may have a diamond shape in a plan view.

In exemplary embodiments of the present invention, the first sensing electrode TE and the second sensing electrode RE may include a conductive material having a light transmissive property. Alternatively, the first sensing electrode TE and the second sensing electrode RE may include a conductive material such as metal or an alloy thereof as long as it has a light transmissive property. In exemplary embodiments of the present invention, when the first sensing electrode TE and the second sensing electrode RE are made of metal or an alloy thereof, the first sensing electrode TE and the second sensing electrode RE may have a mesh structure as illustrated in FIG. 6A to prevent them from being visually recognized by the user. Examples of materials of the first sensing electrode TE and the second sensing electrode RE will be described later.

The plurality of first sensing electrodes TE and second sensing electrodes RE may be spaced apart from each other, and the first sensing electrodes TE adjacent to each other in the first direction DR1 may be electrically connected through the sensing connection electrode CP.

In this case, the first sensing electrode TE and the second sensing electrode RE may be disposed on the same layer, and the sensing connection electrode CP may be disposed on a different layer from the first sensing electrode TE and the second sensing electrode RE. The cross-sectional structure of the sensing element layer SL will be described later with reference to FIGS. 7 and 8.

The sensing contact portions SCP and routing lines TL1, TL2 and RL may be disposed in the sensing peripheral area NSA.

The sensing contact portions SCP may be disposed on one side and the other side at the lower side of the sensing substrate SS. For example, the sensing contact portions SCP may be disposed at opposite sides at the lower side of the sensing substrate SS. The sensing contact portion SCP may be an area (e.g., a sensing contact area) where the routing lines TL1, TL2 and RL are electrically connected to the sensing signal line SSL. Hereinafter, the terms "sensing contact portion" and "sensing contact area" are used interchangeably.

The sensing contact portion (or sensing contact area) SCP in a plan view may be disposed on the inside of the sealing member ST. In other words, the sensing contact portion (or sensing contact area) SCP may be disposed between the edge of the sensing area SA and the sealing member ST in a plan view. In this case, since there is no need for a space in which the sensing contact portion SCP is disposed on the outside of the sealing member ST, a dead space of the display device 1 can be minimized. For example, in a plan view shown in FIG. 6A, the sealing member ST may be disposed at the edge of the second substrate SUB2, thereby minimizing the dead space.

The routing lines TL1, TL2 and RL may include a first routing line TL1, a second routing line TL2, and a third routing line RL.

One end of the first routing line TL1 may be connected to one side of the first sensing electrode TE. In other words, one end of the first routing line TL1 may be connected to the first sensing electrode TE disposed on a first side of the sensing area SA. The first side of the sensing area SA may be the side closest to a region where the sensing contact portions SCP are disposed among the four sides of the sensing area SA. The other end of the first routing line TL1 may extend to the sensing contact portion SCP. In other words, the first routing line TL1 may connect the first sensing electrode TE to the sensing signal line SSL through the sensing contact portion SCP.

One end of the second routing line TL2 may be connected to the other side of the first sensing electrode TE. In other words, one end of the second routing line TL2 may be connected to the first sensing electrode TE disposed on a second side of the sensing area SA. The second side of the sensing area SA is an opposite side of the first side of the sensing area SA, and may be a side located farthest from the region where the sensing contact portions SCP are disposed among the four sides of the sensing area SA. The second routing line TL2 may be connected to the first sensing electrode TE disposed on the second side via the first side and a fourth side of the sensing area SA. For example, the second routing line TL2 may extend from the first side to the second side along the fourth side of the sensing area SA. The other end of the second routing line TL2 may extend to the sensing contact portion SCP. In other words, the second routing line TL2 may connect the first sensing electrode TE to the sensing signal line SSL through the sensing contact portion SCP.

In other words, the routing lines connected to the first sensing electrodes TE may have a double routing structure. Accordingly, it is possible to reduce an RC delay caused by the resistance of the first sensing electrode TE.

One end of the third routing line RL may be connected to one side of the second sensing electrode RE. In other words, one end of the third routing line RL may be connected to the second sensing electrode RE disposed on a third side of the sensing area SA. The third side of the sensing area SA is an opposite side of the fourth side, and may be a side disposed in the second direction DR2 between the first side and the second side. The other end of the third routing line RL may extend to the sensing contact portion SCP. In other words, the third routing line RL may connect the second sensing electrode RE to the sensing signal line SSL through the sensing contact portion SCP.

The first sensing electrodes TE and the second sensing electrodes RE may be driven by a mutual capacitance method or a self-capacitance method.

When the first sensing electrodes TE and the second sensing electrodes RE are driven by a mutual capacitance method, touch driving signals are supplied to the first sensing electrodes TE through the first routing line TL1 and the second routing line TL2 to charge mutual capacitances formed at intersections of the first sensing electrodes TE and the second sensing electrodes RE. Then, the charge change amounts of the mutual capacitances are measured through the second sensing electrodes RE, and it is determined whether a touch input occurs according to the charge change amounts of the mutual capacitances. The touch driving signal may be a signal having a plurality of touch driving pulses.

When the first sensing electrodes TE and the second sensing electrodes RE are driven by a self-capacitance method, touch driving signals are supplied to both the first sensing electrodes TE and the second sensing electrodes RE through the first routing line TL1, the second routing line TL2 and the third routing line RL to charge self-capacitances of the first sensing electrodes TE and the second sensing electrodes RE. Subsequently, the charge change amounts of the self-capacitances are measured through the first routing line TL1, the second routing line TL2 and the third routing line RL, and it is determined whether a touch input occurs according to the charge change amounts of the self-capacitances.

Hereinafter, for simplicity of description, a case of being driven by a mutual capacitance method in which a plurality of touch driving pulses are applied to the first sensing electrodes TE, and the charge change amounts of the mutual capacitances are measured through the third routing line RL connected to the second sensing electrodes RE will be mainly described. In this case, the first sensing electrodes TE may function as touch driving electrodes, the second sensing electrodes RE may function as touch sensing electrodes, the first routing line TL1 and the second routing line TL2 may function as touch driving lines, and the third routing line RL may function as a touch sensing line.

A ground line and/or a guard line may be further disposed in the sensing peripheral area NSA. A ground voltage may be applied to the ground line. Accordingly, when static electricity is applied from the outside, the static electricity may be discharged to the ground line. The guard line may be disposed between the routing lines TL1, TL2 and RL. The guard line may serve to minimize coupling between the routing lines TL1, TL2 and RL.

Figure 6B:
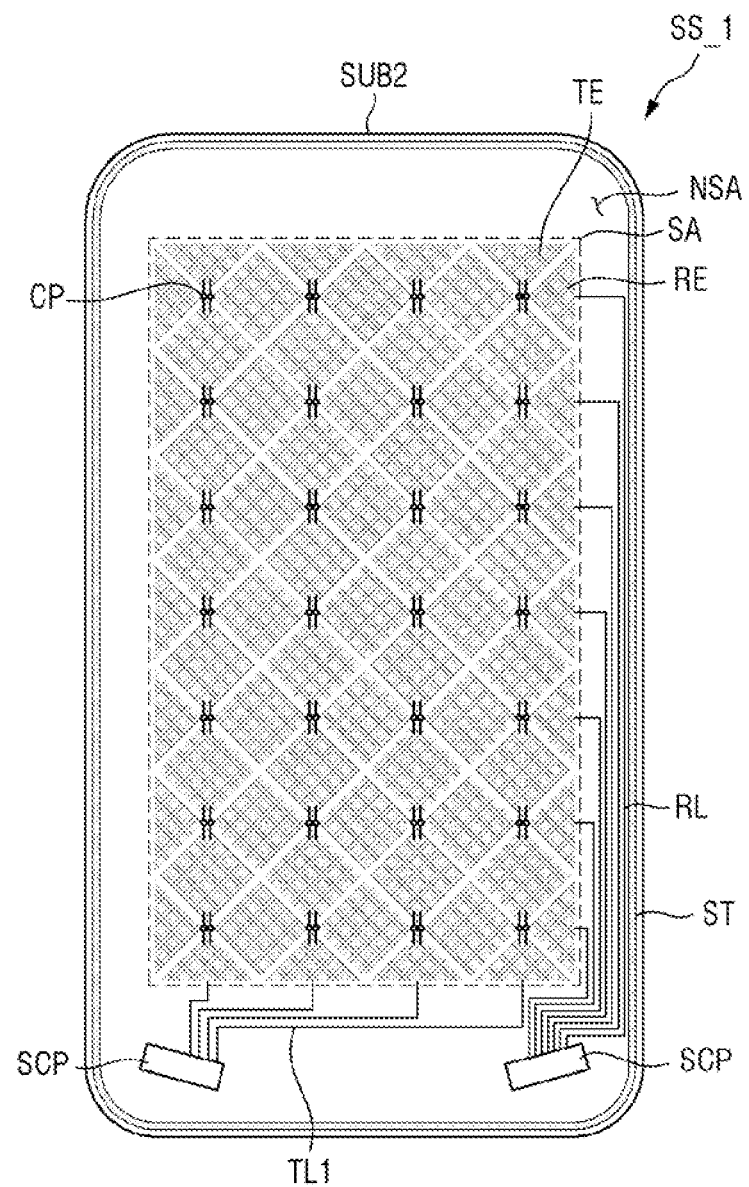
FIG. 6B is a plan view showing a modified structure of the sensing substrate shown in FIG. 6A, according to an exemplary embodiment of the present invention.

FIG. 6B is a plan view showing a modified structure of the sensing substrate shown in FIG. 6A, according to an exemplary embodiment of the present invention.

Referring to FIG. 6B, a sensing substrate SS_1 according to the present embodiment is different from the sensing substrate (SS in FIG. 6A) illustrated in FIG. 6A in that it does not include the second routing line (TL2 in FIG. 6A), and the other configurations are substantially the same or similar. In other words, unlike the structure illustrated in FIG. 6A, in the sensing substrate SS_1 according to the present embodiment, the routing lines connected to the first sensing electrodes TE may have a single routing structure.

On the other hand, the sensing substrate SS_1 may have a structure including the second routing line (112 of FIG. 6A), but excluding the first routing line TL1, as compared to the structure illustrated in FIG. 6A. For example, the sensing substrate SS_1 may have the second routing line TL2 and the third routing line RL but not the first routing line TL1.

Since a description of the other configurations is the same as described above, it will be omitted.

Figure 6C:
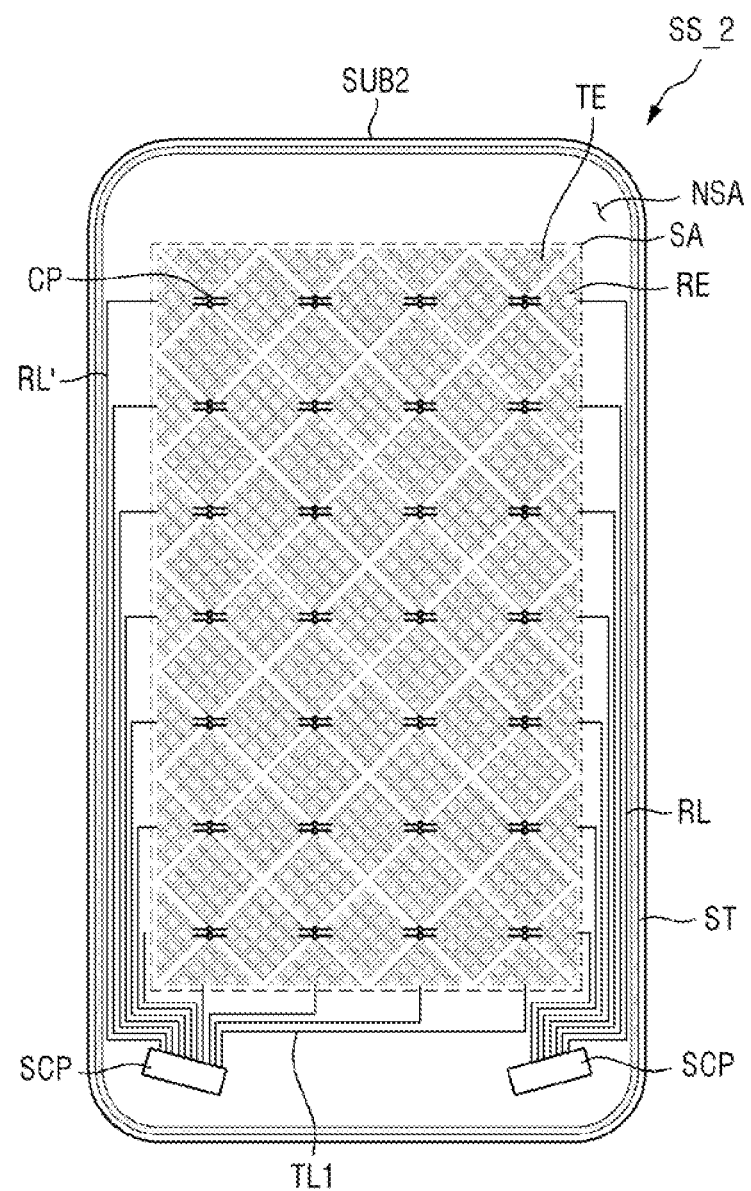
FIG. 6C is a plan view showing another modified structure of the sensing substrate shown in FIG. 6A, according to an exemplary embodiment of the present invention.
Figure 6C:
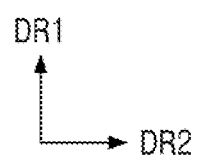

FIG. 6C is a plan view showing another modified structure of the sensing substrate shown in FIG. 6A, according to an exemplary embodiment of the present invention.

Referring to FIG. 6C, a sensing substrate SS_2 according to the present embodiment is different from the sensing substrate (SS in FIG. 6A) illustrated in FIG. 6A in that it does not include the second routing line (TL2 in FIG. 6A) but further includes a fourth routing line RL'. The other configurations of FIG. 6C are substantially the same or similar to those shown in FIG. 6A.

The fourth routing line RL' may be located in the sensing peripheral area NSA. The fourth routing line RL' may be located on the opposite side of the third routing line RL with the sensing area SA interposed therebetween.

One end of the fourth routing line RU may be connected to the other side of the second sensing electrode RE. In other words, one end of the fourth routing line RL' may be connected to the second sensing electrode RE disposed on the fourth side of the sensing area SA. The fourth side of the sensing area SA is an opposite side of the third side, and may be a side disposed in the second direction DR2 between the first side and the second side. The other end of the fourth routing line RL' may extend to the sensing contact portion SCP. In other words, the fourth routing line RL' may connect the second sensing electrode RE to the sensing signal line (SSL in FIG. 3) through the sensing contact portion SCP.

In other words, in the sensing substrate SS_2 according to the present embodiment, unlike the structure illustrated in FIG. 6A, the routing lines connected to the first sensing electrodes TE may have a single routing structure, and the routing lines connected to the second sensing electrodes RE may have a double routing structure.

On the other hand, the sensing substrate SS_-2 may have a structure including the second routing line (112 of FIG. 6A), but excluding the first routing line TL1, as compared to the structure illustrated in FIG. 6A.

In exemplary embodiments of the present invention, the first sensing electrodes TE of the sensing substrate SS_2 may be electrically connected to each other along the first direction DR1. For example, the first sensing electrodes TE adjacent to each other along the first direction DR1 may be connected to each other via a sensing connection electrode CP located on the same layer as the first sensing electrode TE and made of the same material as the first sensing electrode TE.

The second sensing electrodes RE of the sensing substrate SS_2 may be electrically connected to each other along the second direction DR2. For example, the second sensing electrodes RE adjacent to each other along the second direction DR2 may be connected to each other via a connection electrode CE located on a different layer from the second sensing electrode RE.

In exemplary embodiments of the present invention, the first sensing electrode TE, the second sensing electrode RE, and the sensing connection electrode CP may be located on the same layer (hereinafter, referred to as a second sensing conductive layer) and may be made of the same material, and the connection electrode CE connected to the second sensing electrode RE may be located between the substrate SUB2 and the second sensing conductive layer.

Since a description of the other configurations is the same as described above, it will be omitted.

For simplicity of description, the following description will be given in conjunction with the structure of the sensing substrate illustrated in FIG. 6A, but the present invention is not limited thereto. The structure of the sensing substrate may be modified to have the structure shown in FIG. 6B, the structure shown in FIG. 6C, or the like.

Figure 7:
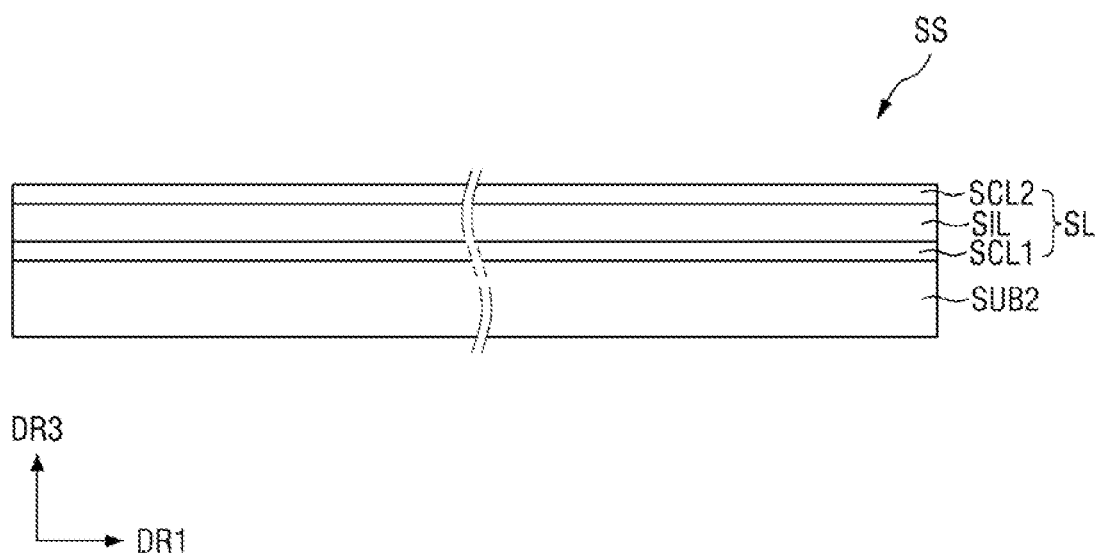
FIG. 7 is a schematic cross-sectional view of the sensing substrate of FIG. 6A.
Figure 8:
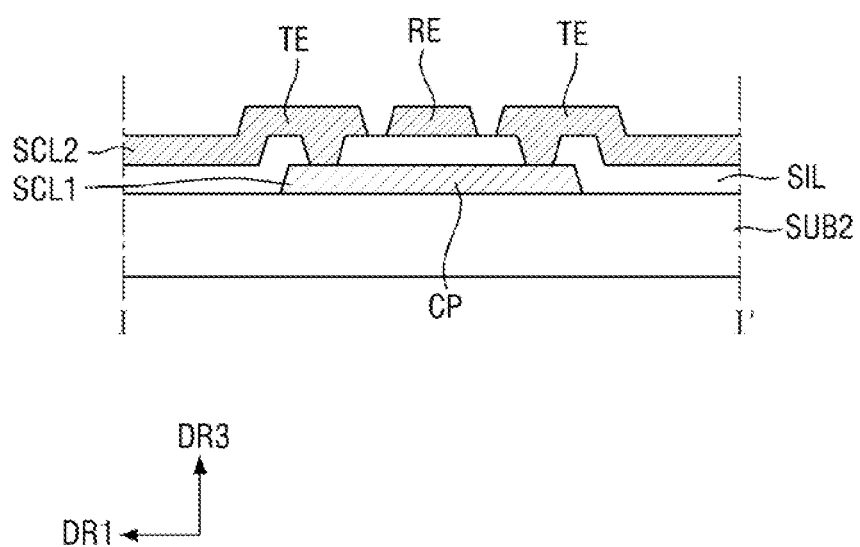
FIG. 8 is a cross-sectional view taken along line I-I' of FIG. 6A.

FIG. 7 is a schematic cross-sectional view of the sensing substrate of FIG. 6A. FIG. 8 is a cross-sectional view taken along line I-I' of FIG. 6A.

Referring to FIGS. 7 and 8, a first sensing conductive layer SCL1, a sensing insulating layer SIL, and a second sensing conductive layer SCL2 may be disposed on the second substrate SUB2 of the sensing substrate SS.

The first sensing conductive layer SCL1 may be directly disposed on the second substrate SUB2. However, the present invention is not limited thereto, and a sensing buffer layer may be further disposed between the first sensing conductive layer SCL1 and the second substrate SUB2. In this case, the first sensing conductive layer SCL1 may be disposed on the sensing buffer layer on the second substrate SUB2. The sensing buffer layer may include an inorganic layer or an organic layer.

The first sensing conductive layer SCL1 may include the sensing connection electrode CP described above with reference to FIG. 6A.

The first sensing conductive layer SCL1 may be formed to have a stacked structure (Ti/Al/Ti) of titanium/aluminum/titanium, a stacked structure (ITO/Al/ITO) of indium tin oxide (ITO)/aluminum/ITO, an APC alloy, or a stacked structure (ITO/APC/ITO) of an APC alloy and ITO, but is not limited thereto.

The sensing insulating layer SIL is disposed on the first sensing conductive layer SCL1. The sensing insulating layer SIL may insulate the first sensing conductive layer SCL1 from the second sensing conductive layer SCL2. The sensing insulating layer SIL may cover portions of the sensing connection electrode CP.

The sensing insulating layer SIL may be formed of an inorganic layer, for example, a silicon nitride layer, a silicon oxynitride layer, a silicon oxide layer, a titanium oxide layer, or an aluminum oxide layer. Alternatively, the sensing insulating layer SIL may be formed of an organic layer such as acryl resin, epoxy resin, phenolic resin, polyamide resin, polyimide resin and the like.

The second sensing conductive layer SCL2 is disposed on the sensing insulating layer SIL. The second sensing conductive layer SCL2 may include the above-described first sensing electrode TE and second sensing electrode RE.

The first sensing electrode TE disposed on one side of the second sensing electrode RE may contact one side of the sensing connection electrode CP through a contact hole passing through the sensing insulating layer SIL. Further, the first sensing electrode TE disposed on the other side of the second sensing electrode RE may contact the other side of the sensing connection electrode CP through a contact hole passing through the sensing insulating layer SIL. Accordingly, the first sensing electrodes TE spaced apart from each other in the first direction DR1 may be electrically connected through the sensing connection electrode CP.

The second sensing conductive layer SCL2 may have a stacked structure (Ti/Al/Ti) of titanium/aluminum/titanium, a stacked structure (ITO/Al/ITO) of indium tin oxide (ITO)/aluminum/ITO, an APC alloy, or a stacked structure (ITO/APC/ITO) of an APC alloy and ITO, but is not limited thereto.

Hereinafter, a case where the sensing substrate itself functions as an encapsulation substrate of the display device and a thin film encapsulation layer is omitted will be described as an example.

Figure 9:
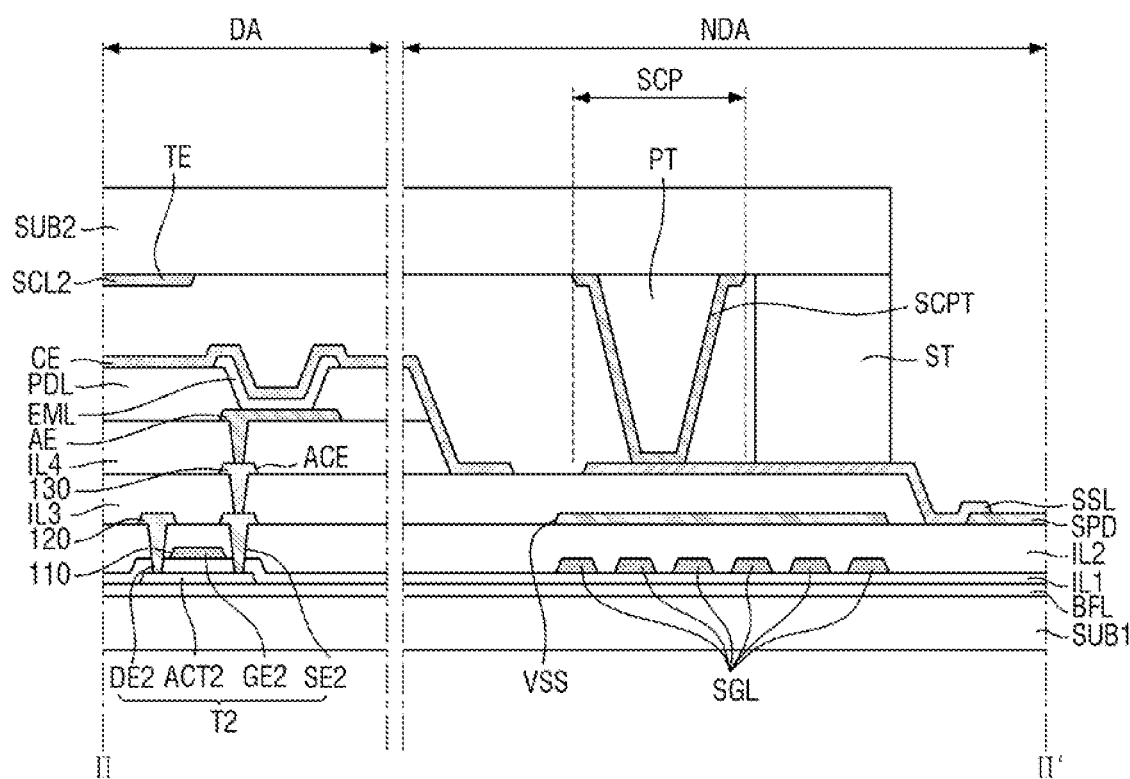
FIG. 9 is a cross-sectional view taken along line II-II' of FIGS. 3 and 6A.

FIG. 9 is a cross-sectional view taken along line II-II' of FIGS. 3 and 6A.

Referring to FIG. 9, the sensing contact portion (or sensing contact area) SCP is located in the non-display area NDA. In the sensing contact portion (or sensing contact area) SCP, the fourth insulating layer IL4 and the pixel defining layer PDL are omitted, and a protrusion portion PT may be disposed in a space in which the fourth insulating layer IL4 and the pixel defining layer PDL are omitted. Accordingly, even if the fourth insulating layer IL4 and the pixel defining layer PDL are omitted, the sensing signal line SSL disposed on the third insulating layer IL3 and the sensing contact pattern SCPT, which is a conductive member disposed on the second substrate SUB2, may be in contact with each other. The protrusion portion PT may have a shape protruding from one surface of the second substrate SUB2. For example, the protrusion portion PT may protrude from the second substrate SUB2 to the first substrate SUB1. In other words, the protrusion portion PT may have a cross-sectional width increasing along the third direction DR3.

In exemplary embodiments of the present invention, the protrusion portion PT may be made of an organic insulating material.

The sensing contact pattern SCPT is a conductive member having conductivity, and may be disposed between the protrusion portion PT and the sensing signal line SSL. The sensing contact pattern SCPT may be disposed along one surface of the protrusion portion PT. The sensing signal line SSL may contact the sensing contact pattern SCPT disposed on one surface of the protrusion portion PT. In other words, the sensing contact pattern SCPT and the sensing signal line SSL may be electrically connected. One end of the sensing signal line SSL may contact the sensing contact pattern SCPT disposed on one surface of the protrusion portion PT. For example, a first end of the sensing signal line SSL may be contact with a portion of the sensing contact pattern SCPT between the first end of the sensing signal line SSL and the protrusion portion PT. The sensing signal line SSL may extend to the outside of the sealing member ST, and the other end of the sensing signal line SSL may contact the sensing pad portion SPD. For example, the sensing signal line SSL may extend from the inside of the sealing member SL to the outside of the sealing member ST such that a second end of the sensing signal line SSL at the outside of the sealing member ST may be in contact with the sensing pad portion SPD. Accordingly, the sensing signal line SSL may electrically connect the sensing contact pattern SCPT disposed on the inside of the sealing member ST to the sensing pad portion SPD disposed on the outside of the sealing member ST.

The sensing contact pattern SCPT may be disposed on the second substrate SUB2. In this case, the sensing contact pattern SCPT is in contact with the second substrate SUB2 and sensing signal line SSL. The sensing contact pattern SCPT may be formed of the second sensing conductive layer SCL2 described above, but is not limited thereto. When the sensing contact pattern SCPT is formed of the second sensing conductive layer SCL2, the sensing contact pattern SCPT may be disposed on the same layer as the sensing electrodes TE and RE. Thus, for example, the sensing contact pattern SCPT may include the same conductive layer as the sensing electrode TE.

The sensing signal line SSL may be disposed on the third insulating layer IL3. The sensing signal line SSL may be formed of the third conductive layer 130 described above, but is not limited thereto. When the sensing signal line SSL is formed of the third conductive layer 130, the sensing signal line SSL may be disposed on the same layer as the connection pattern ACE.

A source voltage line VSS and the signal line SGL may be disposed below the sensing signal line SSL. The source voltage line VSS may be electrically connected to the second electrode CE to provide the second source voltage ELVSS to the light emitting element OLED.

The source voltage line VSS may be disposed between the sensing signal line SSL and the signal line SGL. In other words, the source voltage line VSS may overlap the sensing signal line SSL and the signal line SGL. Accordingly, the source voltage line VSS may shield sensing noise from the signal line SGL It is to be understood that the source voltage line VSS may be referred to as a shielding pattern and that the source voltage line VSS may overlap the signal line SGL or the sensing signal line SSL. The signal line SGL that is overlapped by the source voltage line VSS may be a control signal line.

The source voltage line VSS may be disposed on the second insulating layer IL2. The source voltage line VSS may be formed of the second conductive layer 120 described above, but is not limited thereto. When the source voltage line VSS is formed of the second conductive layer 120, the sensing pad portion SPD may be disposed on the same layer as the first source electrode SE1, the first drain electrode DE1, the second source electrode SE2 and the second drain electrode DE2.

Since the signal line SGL has been described with reference to FIG. 3, a redundant description is omitted.

The sensing pad portion SPD may be disposed on the second insulating layer IL2. The sensing pad portion SPD may be formed of the second conductive layer 120 described above, but is not limited thereto. When the sensing pad portion SPD is formed of the second conductive layer 120, the sensing pad portion SPD may be disposed on the same layer as the first source electrode SE1, the first drain electrode DE1, the second source electrode SE2, the second drain electrode DE2 and the source voltage line VSS.

As described above, when the sensing contact portion SCP is disposed on the inside of the sealing member ST and the protrusion portion PT is formed on the sensing contact portion SCP to connect the sensing contact pattern SCPT to the sensing signal line SSL, since there is no need for an additional space in which the sensing contact portion SCP is disposed on the outside of the sealing member ST, a dead space of the display device 1 can be minimized.

According to an exemplary embodiment of the present invention shown in FIG. 9, a display device may include a first substrate SUB1 including a display area DA and a non-display area NDA; a second substrate SUB2 facing the first substrate SUB1; a sealing member ST disposed in the non-display area NDA; a contact pattern SCPT disposed adjacent to the sealing member ST; and a signal line SSL in contact with the contact pattern SCPT at a first side of the sealing member ST and extending to a second side of the sealing member ST.

Hereinafter, other exemplary embodiments of the present invention will be described. In the following embodiments, a description of the same components as those of the above-described embodiment will be omitted or simplified, and differences will be mainly described.

Figure 10A:
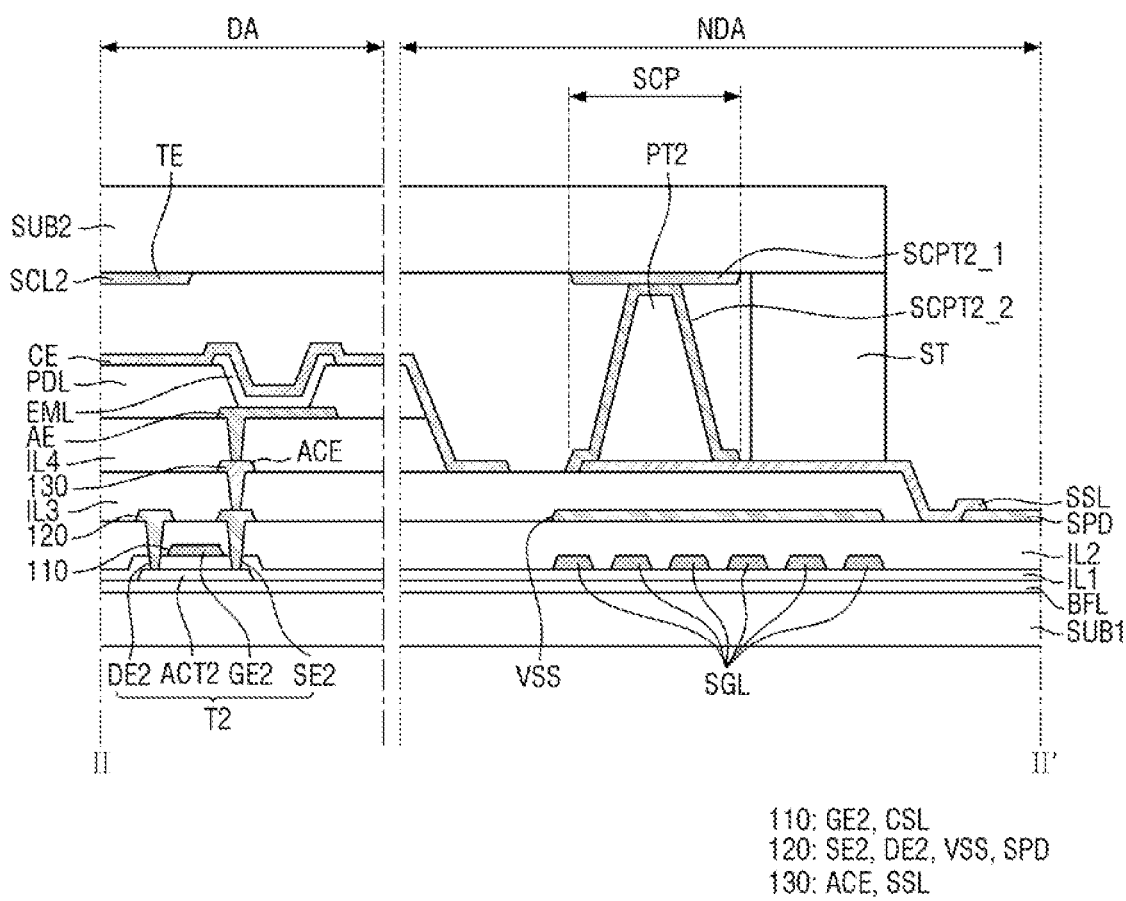
FIG. 10A is a cross-sectional view of a display device according to another exemplary embodiment of the present invention.

FIG. 10A is a cross-sectional view of a display device according to another exemplary embodiment of the present invention.

Referring to FIG. 10A, the present embodiment is different from the embodiment of FIGS. 1 to 9 in that a protrusion portion PT2 of the display device has a shape protruding from the first substrate SUB1.

In exemplary embodiments of the present invention, the protrusion portion PT2 may be located on the sensing signal line SSL, and may have a cross-sectional width decreasing as it goes away from the first substrate SUB1 or as it gets closer to the second substrate SUB2.

Sensing contact patterns SCPT2_1 and SCPT2_2 may be disposed between the second substrate SUB2 and the protrusion portion PT2. The sensing contact patterns SCPT2_1 and SCPT2_2 may include a first sensing contact pattern SCPT2_1 disposed on one surface of the second substrate SUB2 and a second sensing contact pattern SCPT2_2 disposed between the first sensing contact pattern SCPT2_1 and the protrusion portion PT2.

The second sensing contact pattern SCPT2_2 may be disposed along one surface of the protrusion portion PT2. The second sensing contact pattern SCPT2_2 may directly contact the first sensing contact pattern SCPT2_1 on one surface of the protrusion portion PT2. In this case, one surface of the protrusion portion PT2 may be a surface facing the second substrate SUB2. The second sensing contact pattern SCPT2_2 may extend to the edge of the protrusion portion PT2 to contact the sensing signal line SSL disposed below the protrusion portion PT2. The second sensing contact pattern SCPT2_2 may contact the sensing signal line SSL at two areas below the protrusion portion PT2 and may overlap an edge of the sensing signal line SSL. Accordingly, the first sensing contact pattern SCPT2_1 and the sensing signal line SSL may be electrically connected through the second sensing contact pattern SCPT2_2.

The sensing signal line SSL may extend to the outside of the sealing member ST, and the other end of the sensing signal line SSL may contact the sensing pad portion SPD. Accordingly, the sensing signal line SSL may electrically connect the sensing contact patterns SCPT2_1 and SCPT2_2 disposed on the inside of the sealing member ST to the sensing pad portion SPD disposed on the outside of the sealing member ST.

The protrusion portion PT2 may be disposed on the third conductive layer 130. The protrusion portion PT2 may be formed of the same layer as the fourth insulating layer IL4 described above. In other words, the protrusion portion PT2 may be formed simultaneously with the fourth insulating layer IL4.

The first sensing contact pattern SCPT2_1 may be disposed on the second substrate SUB2. The first sensing contact pattern SCPT2_1 may be formed of the second sensing conductive layer SCL2 described above, but is not limited thereto. When the first sensing contact pattern SCPT2_1 is formed of the second sensing conductive layer SCL2, the first sensing contact pattern SCPT2_1 may be disposed on the same layer as the sensing electrodes TE and RE.

The second sensing contact pattern SCPT2_2 may be disposed on the fourth insulating layer IL4. The second sensing contact pattern SCPT2_2 may be formed of the same conductive layer as the first electrode AE described above, but is not limited thereto.

Since the sensing signal line SSL, the sensing pad portion SPD and the like have been described with reference to FIG. 9, a redundant description is omitted.

As described above, when the sensing contact portion SCP is disposed on the inside of the sealing member ST and the protrusion portion PT2 is formed on the sensing contact portion SCP to connect the sensing contact patterns SCPT2_1 and SCPT2_2 to the sensing signal line SSL, since there is no need for an additional space in which the sensing contact portion SCP is disposed on the outside of the sealing member ST, a dead space of the display device 1 can be minimized.

Figure 10B:
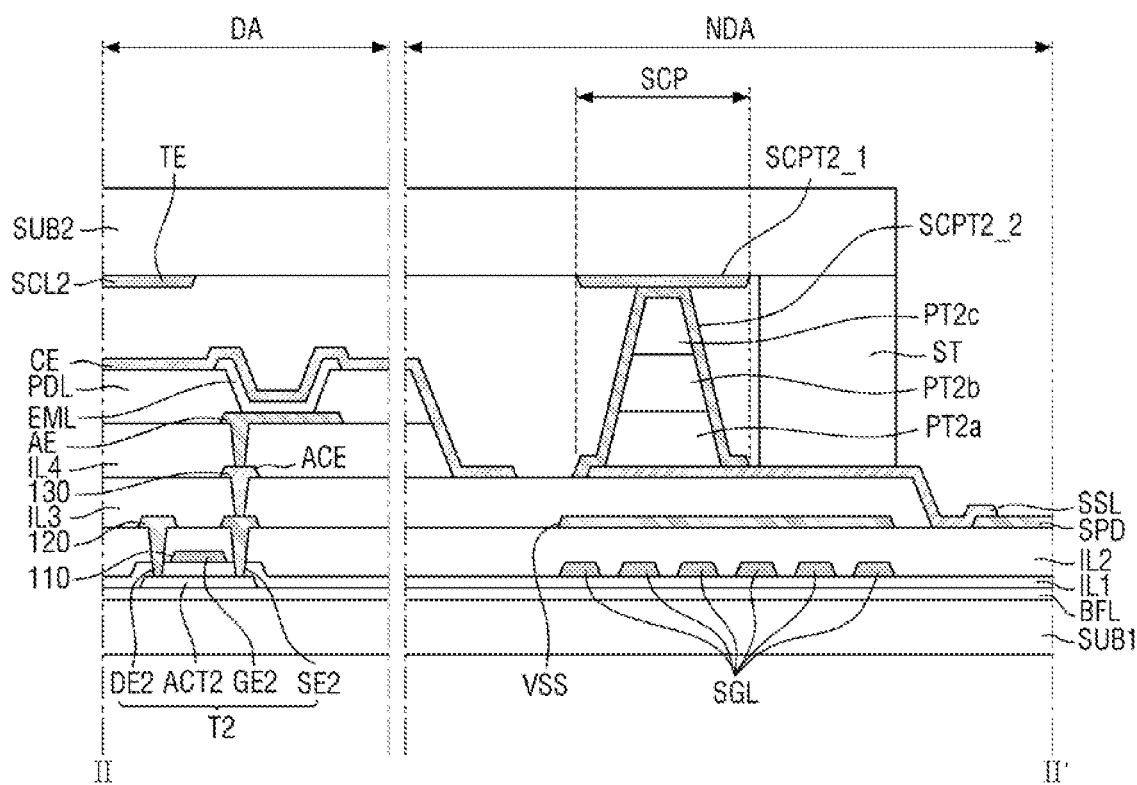
FIG. 10B is a cross-sectional view showing a modified structure of the display device illustrated in FIG. 10A, according to an exemplary embodiment of the present invention.

FIG. 10B is a cross-sectional view showing a modified structure of the display device illustrated in FIG. 10A, according to an exemplary embodiment of the present invention.

Referring to FIG. 10B, the present embodiment is different from the structure shown in FIG. 10A in that a protrusion portion PT2_1 includes a first protrusion pattern PT2a, a second protrusion pattern PT2b and a third protrusion pattern PT2c, and the other configurations are substantially the same or similar. Thus, a redundant description will be omitted and differences will be mainly described.

The first protrusion pattern PT2a may be located on the sensing signal line SSL. The first protrusion pattern PT2a may be formed of the same material and at the same time as the insulating layer located in the display area DA. In exemplary embodiments of the present invention, the first protrusion pattern PT2a may be made of the same organic insulating material as the fourth insulating layer IL4, and may be formed simultaneously in a process of forming the fourth insulating layer IL4.

The second protrusion pattern PT2b may be located on the first protrusion pattern PT2a. The second protrusion pattern PT2b may be formed of the same material and at the same time as the component located in the display area DA. In exemplary embodiments of the present invention, the second protrusion pattern PT2b may be made of the same organic insulating material as the pixel defining layer PDL, and may be formed simultaneously in a process of forming the pixel defining layer PDL.

The third protrusion pattern PT2c may be located on the second protrusion pattern PT2b. In exemplary embodiments of the present invention, the third protrusion pattern PT2c may be made of an organic insulating material.

Figure 10C:
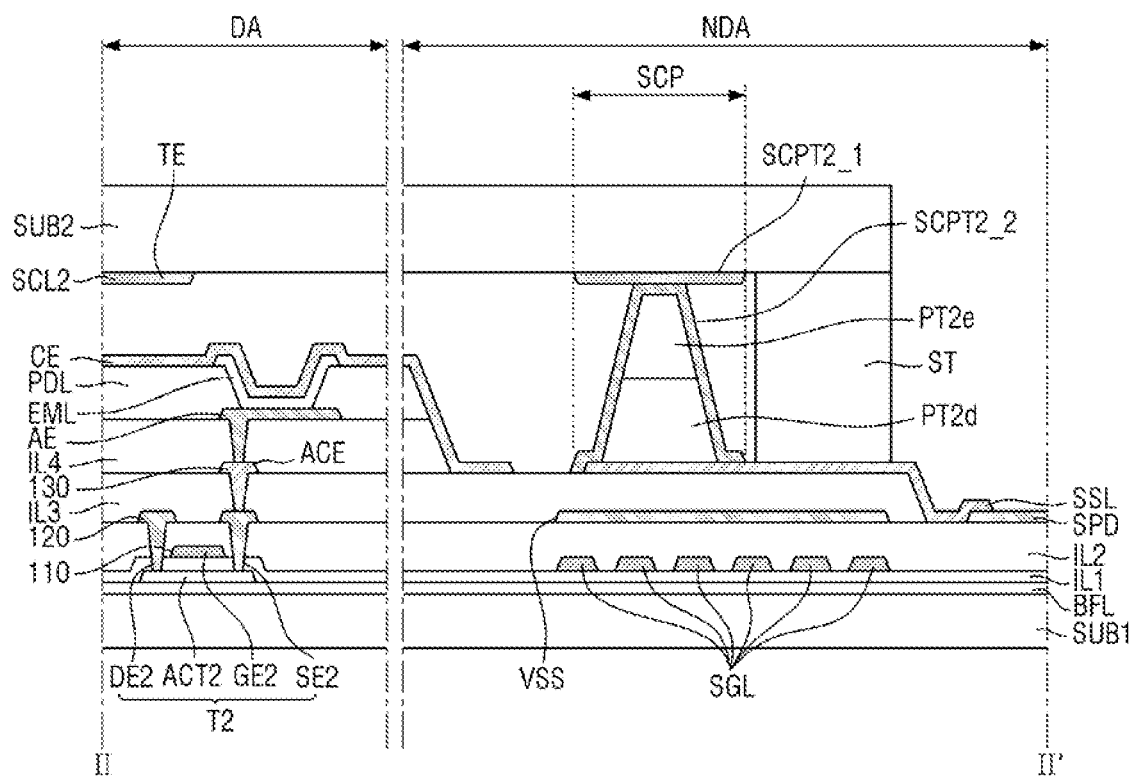
FIG. 10C is a cross-sectional view showing another modified structure of the display device illustrated in FIG. 10A, according to an exemplary embodiment of the present invention.

FIG. 10C is a cross-sectional view showing another modified structure of the display device illustrated in FIG. 10A, according to an exemplary embodiment of the present invention.

Referring to FIG. 10C, the present embodiment is different from the structure shown in FIG. 10A in that a protrusion portion PT2_2 includes a first protrusion pattern PT2d and a second protrusion pattern PT2e, and the other configurations are substantially the same or similar. Thus, a redundant description will be omitted and differences will be mainly described.

The first protrusion pattern PT2*d* may be located on the sensing signal line SSL. In exemplary embodiments of the present invention, the first protrusion pattern PT2*d* may be made of the same organic insulating material as the fourth insulating layer IL4, and may be formed simultaneously in a process of forming the fourth insulating layer IL4.

The second protrusion pattern PT2*e* may be located on the first protrusion pattern PT2*d*. In exemplary embodiments of the present invention, the second protrusion pattern PT2*e* may be made of the same organic insulating material as the pixel defining layer PDL, and may be formed simultaneously in a process of forming the pixel defining layer PDL.

In exemplary embodiments of the present invention, the thickness of the first protrusion pattern PT2*d* may be larger than the thickness of the fourth insulating layer IL4. In exemplary embodiments of the present invention, when the fourth insulating layer IL4 and the first protrusion pattern PT2*d* are made of a photosensitive organic insulating material, by exposing and developing the photosensitive organic insulating material using a halftone mask in a manufacturing process, the thickness of the first protrusion pattern PT2*d* may be formed to be larger than the thickness of the fourth insulating layer ILA.

In exemplary embodiments of the present invention, the thickness of the second protrusion pattern PT2*e* may be larger than the thickness of the pixel defining layer PDL. In exemplary embodiments of the present invention, when the second protrusion pattern PT2*e* and the pixel defining layer PDL are made of a photosensitive organic insulating material, by applying a photosensitive organic insulating material and exposing and developing the photosensitive organic insulating material using a halftone mask, the second protrusion pattern PT2*e* and the pixel defining layer PDL may be formed to have different thicknesses.

Figure 11A:
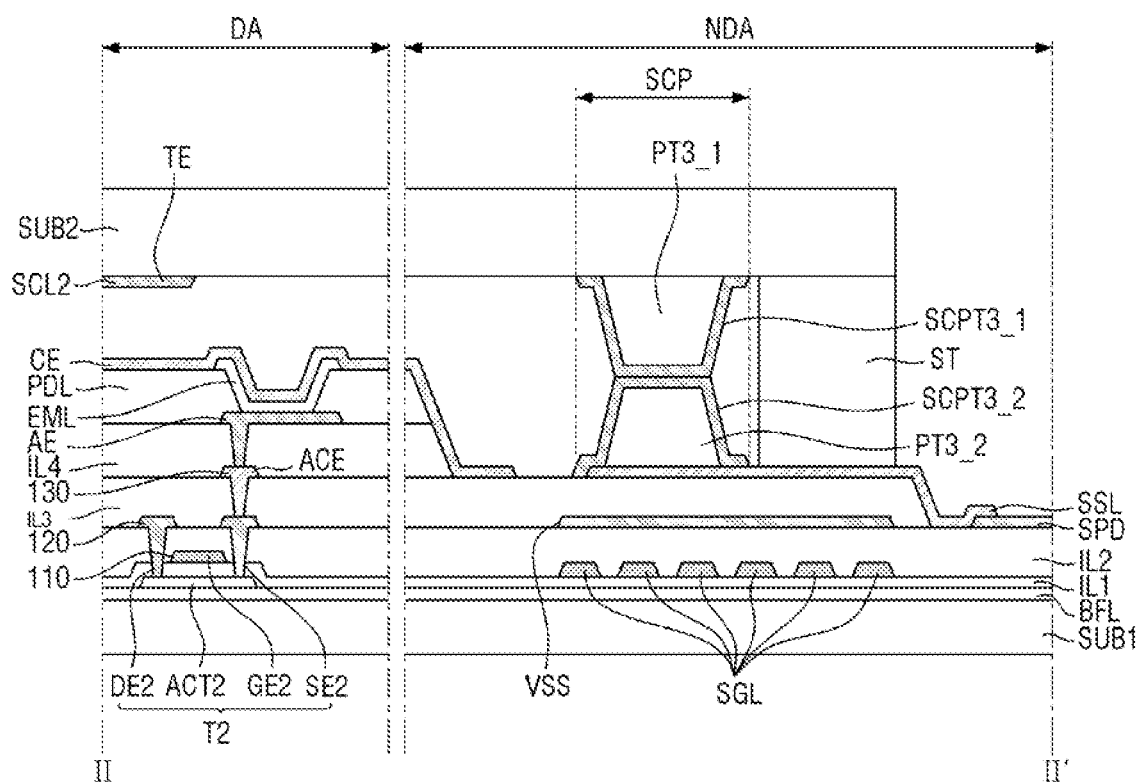
FIG. 11A is a cross-sectional view of a display device according to still another exemplary embodiment of the present invention.

FIG. 11A is a cross-sectional view of a display device according to still another exemplary embodiment of the present invention.

Referring to FIG. 11A, the present embodiment is different from the embodiment of FIGS. 1 to 9 in that protrusion portions PT3_1 and PT3_2 of the display device include a first protrusion portion PT3_1 protruding from the second substrate SUB2 and a second protrusion portion PT3_2 protruding from the first substrate SUB1.

For example, the first protrusion portion PT3_1 may have a cross-sectional width increasing along third direction DR3, and the second protrusion portion PT3_2 may have a cross-sectional width decreasing along third direction DR3.

Sensing contact patterns SCPT3_1 and SCPT3_2 may be disposed between the first protrusion portion PT3_1 and the second protrusion portion PT3_2. The sensing contact patterns SCPT3_1 and SCPT3_2 may include a first sensing contact pattern SCPT3_1 disposed along the top surface of the first protrusion portion PT3_1 and a second sensing contact pattern SCPT3_2 disposed along the top surface of the second protrusion portion PT3_2.

The first sensing contact pattern SCPT3_1 and the second sensing contact pattern SCPT3_2 may be in contact with each other between one surface of the first protrusion portion PT3_1 and one surface of the second protrusion portion PT3_2. In this case, one surface of the first protrusion portion PT3_1 may be a surface facing the second protrusion portion PT3_2, and one surface of the second protrusion portion PT3_2 may be a surface facing the first protrusion portion PT3_1.

The second sensing contact pattern SCPT3_2 may extend to the edge of the second protrusion portion PT3_2 to contact the sensing signal line SSL disposed below the second protrusion portion PT3_2. Accordingly, the first sensing contact pattern SCPT3_1 and the sensing signal line SSL may be electrically connected through the second sensing contact pattern SCPT3_2.

The sensing signal line SSL may extend to the outside of the sealing member ST, and the end of the sensing signal line SSL outside of the sealing member ST may contact the sensing pad portion SPD. Accordingly, the sensing signal line SSL may electrically connect the sensing contact patterns SCPT3_1 and SCPT3_2 disposed on the inside of the sealing member ST to the sensing pad portion SPD disposed on the outside of the sealing member ST.

The first protrusion portion PT3_1 may be disposed on the second substrate SUB2.

The second protrusion portion PT3_2 may be disposed on the third conductive layer 130. The second protrusion portion PT3_2 may be formed of the same layer as the fourth insulating layer HA described above. In other words, the second protrusion portion PT3_2 may be formed simultaneously with the fourth insulating layer IL4.

The first sensing contact pattern SCPT3_1 may be disposed on the second substrate SUB2 and the first protrusion portion PT3_1. The first sensing contact pattern SCPT3_1 may be formed of the second sensing conductive layer SCL2 described above, but is not limited thereto. When the first sensing contact pattern SCPT3_1 is formed of the second sensing conductive layer SCL2, the first sensing contact pattern SCPT3_1 may be disposed on the same layer as the sensing electrodes TE and RE.

The second sensing contact pattern SCPT3_2 may be disposed on the fourth insulating layer IL4. The second sensing contact pattern SCPT3_2 may be formed of the same conductive layer as the first electrode AE described above, but is not limited thereto.

As described above, when the sensing contact portion SCP is disposed on the inside of the sealing member ST and the protrusion portions PT3.1 and PT3.2 are formed on the sensing contact portion SCP to connect the sensing contact patterns SCPT3_1 and SCPT3_2 to the sensing signal line SSL, since there is no need for an additional space in which the sensing contact portion SCP is disposed on the outside of the sealing member ST, a dead space of the display device 1 can be minimized.

Figure 11B:
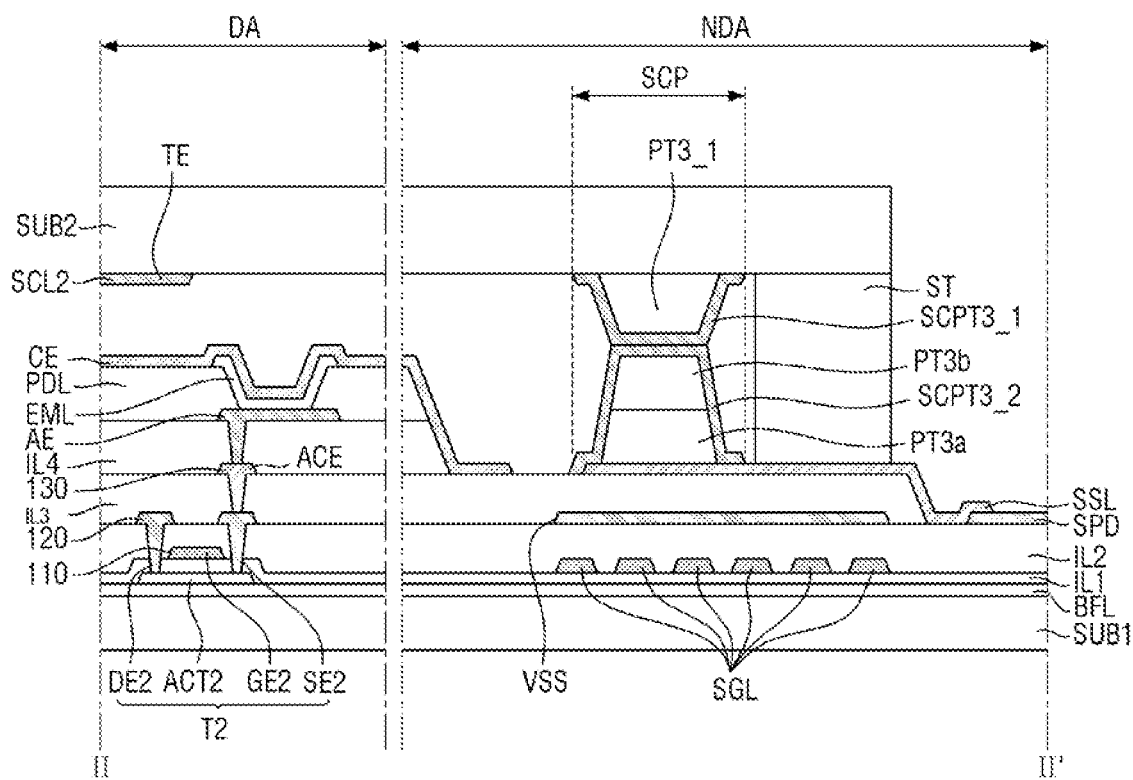
FIG. 11B is a cross-sectional view showing a modified structure of the display device illustrated in FIG. 11A.

FIG. 11B is a cross-sectional view showing a modified structure of the display device illustrated in FIG. 11A, according to an exemplary embodiment of the present invention.

Referring to FIG. 11B, the present embodiment is different from the structure shown in FIG. 11A in that a second protrusion portion PT3_3 includes a first protrusion pattern PT3*a* located on the sensing signal line SSL and a second protrusion pattern PT3*b* located on the first protrusion pattern PT3*a*, and the other configurations are substantially the same or similar.

In exemplary embodiments of the present invention, the first protrusion pattern PT3*a* may be made of the same organic insulating material as the fourth insulating layer IL4, and may be formed simultaneously in a process of forming the fourth insulating layer IL4.

In exemplary embodiments of the present invention, the second protrusion pattern PT3*b* may be made of the same organic insulating material as the pixel defining layer PDL, and may be formed simultaneously in a process of forming the pixel defining layer PDL According to exemplary embodiments of the present invention, there is provided a display device having an in-cell touch structure with a reduced dead space by placing a sensing contact portion on the inside of a sealing member.

Although exemplary embodiments of the present invention have been described with reference to the accompanying drawings, those skilled in the art would understand that various modifications and alterations may be made thereto without departing from the scope of the present invention as set forth in the claims.

What is claimed is:

1. A display device, comprising:
a first substrate including a display area and a non-display area;
a second substrate facing the first substrate;
a sealing member disposed in the non-display area and coupling the first substrate to the second substrate;
a sensing contact area disposed at an inner side of the sealing member;
a sensing signal line on the first substrate, the sensing signal line being disposed in the sensing contact area;
a sensing contact pattern on the second substrate, the sensing contact pattern being disposed in the sensing contact area and electrically connected to the sensing signal line;
a control signal line disposed between the first substrate and the sensing signal line;
a shielding pattern disposed between the control signal line and the sensing signal line, the shielding pattern overlapping the control signal line or the sensing signal line;
a first electrode on the first substrate;
a pixel defining layer on the first substrate and exposing at least a portion of the first electrode; and
a protrusion portion disposed in the sensing contact area and overlapping the sensing contact pattern,
wherein a thickness of the protrusion portion is greater than a thickness of the pixel defining layer.

2. The display device of claim 1, wherein the protrusion portion is disposed between the second substrate and the sensing contact pattern,
wherein the sensing contact pattern is disposed along a surface of the protrusion portion.

3. The display device of claim 2, wherein the sensing contact pattern is in contact with the sensing signal line on the surface of the protrusion portion.

4. The display device of claim 2, further comprising:
a plurality of first sensing electrodes disposed in the display area, wherein the first sensing electrodes are arranged in a plurality of columns; and
a sensing connection electrode connecting the first sensing electrodes,
wherein the sensing contact pattern includes the same conductive layer as the first sensing electrode.

5. The display device of claim 1, wherein the protrusion portion is disposed between the second substrate and the sensing signal line,
wherein the sensing contact pattern is disposed between the second substrate and the protrusion portion.

6. The display device of claim 5, wherein the sensing contact pattern includes a first sensing contact pattern disposed on the second substrate and a second sensing contact pattern disposed between the first sensing contact pattern and the protrusion portion, and the second sensing contact pattern is in contact with the sensing signal line.

7. The display device of claim 6, wherein the second sensing contact pattern is disposed along a surface of the protrusion portion, and the first sensing contact pattern and the second sensing contact pattern are in contact with each other on the surface of the protrusion portion.

8. The display device of claim 1, wherein the protrusion portion comprises:
a first protrusion portion disposed between the second substrate and the sensing signal line; and
a second protrusion portion disposed between the first protrusion portion and the sensing signal line,
wherein the sensing contact pattern is disposed between the first protrusion portion and the second protrusion portion.

9. The display device of claim 8, wherein the sensing contact pattern includes a first sensing contact pattern disposed along the first protrusion portion, and a second sensing contact pattern disposed along the second protrusion portion, and the second sensing contact pattern is in contact with the sensing signal line.

10. The display device of claim 9, wherein the first sensing contact pattern and the second sensing contact pattern are in contact with each other between the first protrusion portion and the second protrusion portion.

11. The display device of claim 1, further comprising:
a source electrode or a drain electrode arranged at the same layer as the shielding pattern.

12. The display device of claim 11, further comprising:
a second electrode disposed on the first electrode; and
a light emitting layer disposed between the first electrode and the second electrode,
wherein the first electrode is electrically connected to the source electrode or the drain electrode and the shielding pattern is electrically connected to the second electrode.

13. The display device of claim 12, further comprising:
a connection pattern connecting the source electrode or the drain electrode to the first electrode,
wherein the connection pattern includes the same conductive layer as the sensing signal line.

14. The display device of claim 13, further comprising:
an insulating layer disposed between the first electrode and the connection pattern, wherein the
protrusion portion is disposed in the sensing contact area and includes the same material as the insulating layer.

15. The display device of claim 14, wherein a first surface of the protrusion portion is in contact with the sensing contact pattern, and a second surface of the protrusion portion is in contact with the sensing signal line.

16. The display device of claim 14, wherein the sensing contact pattern includes a first sensing contact pattern and a second sensing contact pattern disposed between the second substrate and the protrusion portion, and the second sensing contact pattern is disposed along a surface of the protrusion portion.

17. The display device of claim 16, wherein the second sensing contact pattern includes the same conductive layer as the first electrode.

18. The display device of claim 16, further comprising:
a plurality of first sensing electrodes disposed in the display area, wherein the first sensing electrodes are arranged in a plurality of columns; and
a sensing connection electrode connecting the first sensing electrodes,
wherein the first sensing contact pattern includes the same conductive layer as the first sensing electrode.

19. The display device of claim 1, further comprising:
a sensing pad portion disposed at an outer side of the sealing member, wherein the sensing signal line is electrically connected to the sensing pad portion.

20. The display device of claim 19, wherein the sensing pad portion includes the same conductive layer as the shielding pattern.

21. A display device, comprising:
a first substrate including a display area and a non-display area surrounding the display area, the non-display area including a sensing contact area;
a second substrate facing the first substrate;
a sensing signal line on the first substrate, the sensing signal line being located between the first substrate and the second substrate and located in the sensing contact area;
a conductive member on the second substrate, the conductive member being disposed in the sensing contact area and electrically connected to the sensing signal line;
a control signal line disposed between the first substrate and the sensing signal line;
a voltage line disposed between the control signal line and the sensing signal line, the voltage line overlapping the control signal line or the sensing signal line;
a first electrode on the first substrate;
a pixel defining layer on the first substrate and exposing at least a portion of the first electrode; and
a protrusion portion disposed in the sensing contact area and overlapping a sensing contact pattern,
wherein a thickness of the protrusion portion is greater than a thickness of the pixel defining layer.

22. The display device of claim 21, wherein the conductive member is disposed at a first side of a sealing member, the sensing signal line extending from the first side of the sealing member to a second side of the sealing member to contact a sensing pad.

23. The display device of claim 21, wherein the conductive member is in contact with the first substrate and the second substrate.

24. The display device of claim 21, wherein the voltage line is electrically connected to a light emitting element in the display area.

25. A display device, comprising:
a first substrate including a display area and a non-display area;
a second substrate facing the first substrate;
a sealing member disposed in the non-display area;
a contact pattern on the second substrate, the contact pattern being disposed adjacent to the sealing member;
a first signal line on the first substrate, the first signal line being in contact with the contact pattern at a first side of the sealing member and extending to a second side of the sealing member;
a second signal line disposed between the first substrate and the first signal line;
a shield disposed between the first signal line and the second signal line;
a first electrode on the first substrate;
a pixel defining layer on the first substrate and exposing at least a portion of the first electrode; and
a protrusion portion overlapping the contact pattern,
wherein a thickness of the protrusion portion is greater than a thickness of the pixel defining layer.

\* \* \* \* \*

UNITED STATES PATENT AND TRADEMARK OFFICE
CERTIFICATE OF CORRECTION

| | | |
|---|---|---|
| PATENT NO. | : 11,720,191 B2 | Page 1 of 1 |
| APPLICATION NO. | : 17/148081 | |
| DATED | : August 8, 2023 | |
| INVENTOR(S) | : Yong Jun Jo et al. | |

It is certified that error appears in the above-identified patent and that said Letters Patent is hereby corrected as shown below:

On the Title Page

Item (72), please correct the spelling of the second inventor's name from 'Kwang Chui Jung' to 'Kwang Chul Jung'

Signed and Sealed this
Seventh Day of November, 2023

Katherine Kelly Vidal
*Director of the United States Patent and Trademark Office*